US012050886B2

(12) United States Patent
Myung et al.

(10) Patent No.: US 12,050,886 B2
(45) Date of Patent: Jul. 30, 2024

(54) NEUROMORPHIC DEVICE AND DRIVING METHOD THEREOF

(71) Applicant: Samsung Electronics Co., Ltd., Suwon-si (KR)

(72) Inventors: Sungmeen Myung, Suwon-si (KR); Sangjoon Kim, Hwaseong-si (KR); Seungchul Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 874 days.

(21) Appl. No.: 17/075,774

(22) Filed: Oct. 21, 2020

(65) Prior Publication Data

US 2021/0303266 A1 Sep. 30, 2021

(30) Foreign Application Priority Data

Mar. 25, 2020 (KR) .................. 10-2020-0036433

(51) Int. Cl.
*G06F 7/544* (2006.01)
*G01R 19/00* (2006.01)
(Continued)

(52) U.S. Cl.
CPC ....... *G06F 7/5443* (2013.01); *G01R 19/0046* (2013.01); *G06F 13/4022* (2013.01); *G06F 13/4282* (2013.01); *G06N 3/04* (2013.01); *G11C 11/161* (2013.01); *G11C 11/1673* (2013.01); *G11C 11/54* (2013.01)

(58) Field of Classification Search
CPC ............... G06F 7/5443; G06F 13/4022; G06F 13/4282; G01R 19/0046; G06N 3/04; G06N 3/065; G06N 3/048; G06N 3/08; G06N 3/045; G06N 3/063; G11C 11/1673;
(Continued)

(56) References Cited

U.S. PATENT DOCUMENTS 10,417,460 B1 9/2019 Youssefi
10,819,303 B1 * 10/2020 Park .................. H01L 25/18
(Continued)

FOREIGN PATENT DOCUMENTS

CN 105389279 A * 3/2016 ......... G06F 13/4086
CN 107688366 A * 2/2018 ............. G05F 1/575
(Continued)

OTHER PUBLICATIONS

Wei Yi et al., "Biological Plausibility and Stochasticity in Scalable VO2 Active Memristor Neurons", arxiv.org, Cornell University Library, 201 Olin Library Cornell University Ithaca, NY 14853, (Sep. 20, 2018), XP081085523 (79 pages in English).
(Continued)

*Primary Examiner* — Tan V Mai
(74) *Attorney, Agent, or Firm* — NSIP Law

(57) ABSTRACT

A neuromorphic device includes a first resistor line having a plurality of first resistors that are serially connected to each other, a second resistor line having a plurality of second resistors that are serially connected to each other, one or more current sources to control a current flowing in each of the first resistor line and the second resistor line to a respective current value, a first capacitor electrically connectable to the first resistor line, and a second capacitor electrically connectable to the second resistor line.

36 Claims, 22 Drawing Sheets

(51) Int. Cl.
  *G06F 13/40* (2006.01)
  *G06F 13/42* (2006.01)
  *G06N 3/04* (2023.01)
  *G11C 11/16* (2006.01)
  *G11C 11/54* (2006.01)

(58) Field of Classification Search
  CPC ... G11C 11/54; G11C 7/1006; G11C 11/1659; G11C 13/003; Y02D 10/00; H02M 3/06
  USPC .......................................... 708/524; 706/41
  See application file for complete search history.

(56) References Cited

U.S. PATENT DOCUMENTS

| | | |
|---|---|---|
| 2016/0371582 A1 | 12/2016 | Eleftheriou et al. |
| 2018/0253643 A1 | 9/2018 | Buchanan et al. |
| 2018/0300618 A1 | 10/2018 | Obradovic et al. |
| 2019/0019538 A1 | 1/2019 | Li et al. |
| 2019/0088309 A1 | 3/2019 | Li et al. |
| 2019/0286419 A1 | 9/2019 | Lin et al. |
| 2019/0286976 A1 | 9/2019 | Tran et al. |

FOREIGN PATENT DOCUMENTS

| | | |
|---|---|---|
| KR | 20150017047 A * | 2/2015 |
| WO | WO 2017/105514 A1 | 6/2017 |

OTHER PUBLICATIONS

Shimeng Yu et al., "An Electronic Synapse Device Based on Metal Oxide Resistive Switching Memory for Neuromorphic Computation", IEEE Transactions on Electron Devices, IEEE, USA, (Aug. 1, 2011), vol. 58, No. 8, ISSN 0018-9383, pp. 2729-2737, XP011336315.

Li, Yunning et al., "Analog Computing Using 1T1R Crossbar Arrays", Masters Theses, University of Massachusetts Amherst, Feb. 2018, XP055860081, (81 pages in English).

Extended European search report issued on Jan. 12, 2022, in counterpart European Patent Application No. 21154932.4 (10 pages in English).

* cited by examiner

NEUROMORPHIC DEVICE AND DRIVING METHOD THEREOF

CROSS-REFERENCE TO RELATED APPLICATION

This application claims the benefit under 35 U.S.C. § 119 of Korean Patent Application No. 10-2020-0036433, filed on Mar. 25, 2020, in the Korean Intellectual Property Office, the entire disclosure of which is incorporated herein by reference for all purposes.

BACKGROUND

1. Field

The disclosure relates to a neuromorphic device and a driving method thereof.

2. Description of Related Art

Processing of a neural network in a neural network device includes a multiply-accumulate (MAC) operation of repeating multiplication and addition. An operation of multiplying node values of a previous layer with weights mapped thereto and adding multiplication results and then applying an appropriate activation function to an addition result may be performed at a specific node of a neural network. To perform the operation, a memory access operation of loading appropriate input and weight at a desired time point and a MAC operation of multiplying and adding the loaded input and weight may be repeated. Various methods of efficiently performing neural network processing such as the MAC operation by using other hardware architecture, instead of processing a neural network by using a generally known digital computer have been performed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A neuromorphic device having improved reliability and power efficiency of an analog operation and an electronic system including the same.

In one general aspect, a neuromorphic device includes a first resistor line comprising a plurality of first resistors that are serially connected to each other, a second resistor line comprising a plurality of second resistors that are serially connected to each other, one or more current sources configured to control a current flowing in each of the first resistor line and the second resistor line to a respective current value, a first capacitor configured to be electrically connected to the first resistor line, and a second capacitor configured to be electrically connected to the second resistor line.

The neuromorphic device may further include a switch configured to connect the first capacitor to the second capacitor in parallel.

The neuromorphic device may further include a voltage meter configured to measure a voltage difference between both terminals of each of the first and second capacitors in a case in which the first and second capacitors are connected in parallel.

The one or more current sources may include a plurality of current sources including at least one first current source connected to the first resistor line and at least one second current source connected to the second resistor line.

The one or more current sources may include one current source that is commonly connected to the first resistor line and the second resistor line.

The neuromorphic device may further include a controller configured to apply inputs and weights to the plurality of first resistors and the plurality of second resistors.

The one or more current sources may be further configured to control a first current flowing in the first resistor line and a second current flowing in the second resistor line to a same current value.

The neuromorphic device may further include a controller configured to apply inputs and weights to the plurality of first resistors and the plurality of second resistors, and the controller may be configured to independently control inputs to be applied to the plurality of first resistors and the plurality of second resistors.

The first capacitor and the second capacitor may have a same capacitance.

The neuromorphic device may further include a first switch disposed between the first capacitor and the first resistor line, and a second switch disposed between the second capacitor and the second resistor line.

Each of the plurality of resistors may include a magnetic memory device having a plurality of resistance values.

A first terminal of the first capacitor and a first terminal of the second capacitor may be electrically connected to each other.

In another general aspect, a method of driving a neuromorphic device includes applying a current having a current value to each of a first resistor line including a plurality of first resistors that are serially connected to each other and a second resistor line including a plurality of second resistors that are serially connected to each other, sampling a first voltage of the first resistor line by using a first capacitor connected to the first resistor line, and a second voltage of the second resistor line by using a second capacitor connected to the second resistor line, and measuring a voltage between both terminals of each of the first capacitor and the second capacitor in a case in which the first capacitor and the second capacitor are connected in parallel by switching a first terminal of the first capacitor and a first terminal of the second capacitor to be connected in parallel to each other.

The method may further include calculating a sum of multiplications of inputs and weights applied to the plurality of first resistors and the plurality of second resistors from the measured voltage.

The method may further include applying a resistance value to a variable resistor included in each of the first resistors and the second resistors.

The sampling of the first voltage and the second voltage may include sampling of the second voltage after sampling of the first voltage.

In another general aspect, a neuromorphic device includes a resistor line to which each of a plurality of resistors are serially connected, and a current source configured to apply a current to the resistor line, wherein each of the plurality of resistors includes at least two variable resistors that are connected in parallel to each other and switches that are respectively serially connected to the variable resistors.

Each of the plurality of resistors may include a pair of variable resistors, each of the pair of variable resistors may be a variable resistance device having a first or second resistance value, and when one variable resistor of each of the pairs of variable resistors has the first resistance value, the other variable resistor may have the second resistance value.

The neuromorphic device may further include a first weight line and a second weight line that are electrically connected to both terminals of each of the variable resistors.

The neuromorphic device may further include a voltage meter configured to measure a voltage of the resistor line.

The neuromorphic device may further include a controller configured to apply inputs and weights to the plurality of resistors, and a sum of the inputs and weights applied to the plurality of resistors may be calculated from a voltage measured by the voltage meter.

In another general aspect, a method of driving a neuromorphic device includes applying inputs and weights to each of resistors including at least two variable resistors connected in parallel to each other and switches respectively serially connected to the variable resistors, applying a current a resistor line to which the resistors are serially connected, and obtaining a sum of multiplications of the inputs and weights applied to the resistors from a voltage generated in the resistor line by the applied current.

Each of the resistors may include a pair of variable resistors, and the applying of the inputs and the weights to each of the resistors may include applying the inputs and the weights such that the pair of variable resistors respectively included in the plurality of resistors are set to have different resistance values.

The applying of the current may include applying the current by closing at least one of the switches included in each of the resistors to allow the current flow through one variable resistor of the variable resistors respectively included in the resistors.

In another general aspect, an electronic system includes a neural network device including a neuromorphic device, and a central processing unit (CPU) including a processor core and configured to control a function of the neural network device, wherein the neuromorphic device includes a first resistor line comprising a plurality of first resistors that are serially connected to each other, a second resistor line comprising a plurality of second resistors that are serially connected to each other, one or more current sources configured to control a current flowing in each of the first resistor line and the second resistor line to a respective current value, a first capacitor configured to be electrically connected to the first resistor line, and a second capacitor configured to be electrically connected to the second resistor line.

The neuromorphic device may further include a switch configured to connect the first capacitor to the second capacitor in parallel.

The neuromorphic device may further include a voltage meter configured to measure a voltage difference between both terminals of each of the first and second capacitors in a case in which the first and second capacitors are connected in parallel.

In another general aspect, an electronic system includes a neural network device including a neuromorphic device, and a central processing unit (CPU) including a processor core and configured to control a function of the neural network device, wherein the neuromorphic device includes a resistor line to which each of a plurality of resistors are serially connected, and a current source configured to apply a current to the resistor line, wherein each of the plurality of resistors includes at least two variable resistors that are connected in parallel to each other and switches that are respectively serially connected to the variable resistors.

Each of the resistors may include a pair of variable resistors, each of the pair of variable resistors may be a variable resistance device having a first or second resistance value, and when one variable resistor of each of the pairs of variable resistors has the first resistance value, the other variable resistor may have the second resistance value.

The neuromorphic device may further include a first weight line and a second weight line that are electrically connected to both terminals of each of the variable resistors.

The neuromorphic device may further include a voltage meter configured to measure a voltage of the resistor line.

In another general aspect, a neuromorphic device includes a first capacitor configured to be connected to a first resistor line via a first switch and to sample a total voltage of first resistor line in a first state in which the first switch is closed; a second capacitor configured to be connected to a second resistor line via a second switch and to sample a total voltage of second resistor line in the first state in which the second switch is closed; a third switch configured to connect the first capacitor and the second capacitor in parallel in a second state in which the first switch is open and the second switch is open; and a voltage meter configured to measure a first voltage across the first capacitor and a second voltage across the second capacitor and to output an output value based on the sum of the first voltage and the second voltage.

The output value may be a sum of multiplications of inputs and weights applied to resistors included in each of the first resistor line and the second resistor line.

A first terminal of the first capacitor may be connected to the first resistor line in the first state, a first terminal of the second capacitor may be connected to the second resistor line in the first state, and the third switch may be connected between the first terminal of the first capacitor and the first terminal of the second capacitor.

A first terminal of the first capacitor may be connected to the first resistor line in the first state, a first terminal of the second capacitor may be connected to the second resistor line in the first state, and the third switch may be connected to a second terminal of the first capacitor and a second terminal of the second capacitor.

Other features and aspects will be apparent from the following detailed description, the drawings, and the claims.

Figure 1:
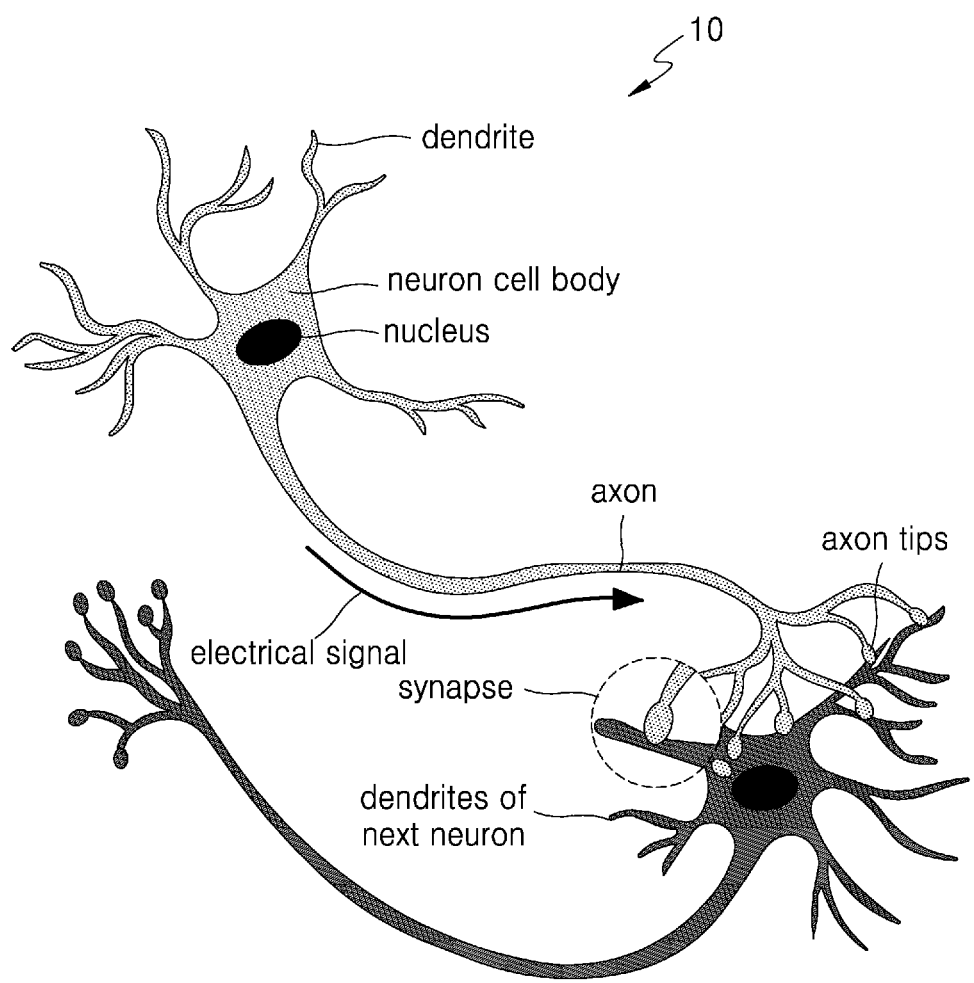
FIG. 1 illustrates a biological neuron and an operation thereof.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all examples are not limited thereto.

The examples described below relate to a technical field of a neuromorphic device, for example, a neuromorphic processor, and detailed descriptions on items that are well-known to a person skilled in the art are omitted.

A neuromorphic device, unlike a general digital computer in which information is exchanged by using a common data bus, may be provided with an analog circuit for processing multiplication and addition operations, and related examples are described below with reference to the drawings.

FIG. 1 illustrates a biological neuron 10 and an operation thereof.

Referring to FIG. 1, the biological neuron 10 may refer to a cell in a nervous system of a human and may be one of fundamental biological calculation objects. A human brain may include about 100 billion biological neurons and about 100 trillion interconnections between the biological neurons.

The biological neuron 10 is a single cell and may include a nucleus and a neuron cell body including various organelles. The various organelles include mitochondria, a number of dendrites radiating from the neuron cell body, and axons terminating at many branch extensions.

In general, the axon transmits signals from one neuron to another neuron, and the dendrites receive signals from another neuron. For example, when different neurons are connected to each other, a signal transmitted through the axon of a neuron may be received by the dendrites of another neuron. In this case, signals between neurons are transmitted through specialized connections called synapses, and several neurons are connected to each other to form a neural network. A neuron that secretes a neurotransmitter based on synapses is referred to as a pre-synaptic neuron, and a neuron that receives information transmitted through the neurotransmitter is referred to as a post-synaptic neuron.

The human brain may learn and remember a huge amount of information by transmitting and processing various signals through a neural network that is formed as a large number of the neurons are interconnected. A variety of attempts to develop a computing device to efficiently process a huge amount of information by simulating the biological neural network are continuing.

Figure 2:
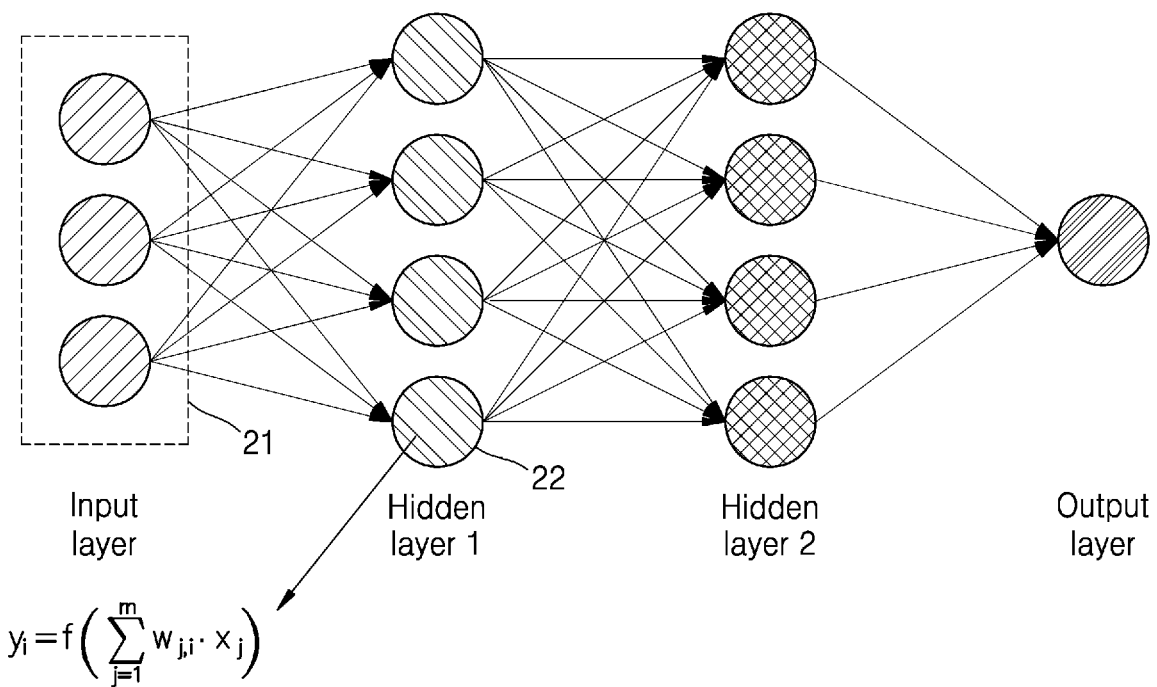
FIG. 2 illustrates an example of a neural network.

FIG. 2 illustrates an example of a neural network.

Referring to FIG. 2, an example of an artificial neural network, that is, a neural network 20, that simulates the above-described biological neural network, is illustrated. The neural network 20 may correspond to an example of a deep neural network (DNN). Although, for convenience of explanation, the neural network 20 is illustrated as including two hidden layers, the neural network 20 may include various numbers of hidden layers. Furthermore, although FIG. 2 illustrates that the neural network 20 separately includes an input layer 21 for receiving input data, the input data may be directly input to the hidden layers.

In the neural network 20, artificial nodes of layers, except an output layer, may be connected to artificial nodes of a next layer via links for transmitting an output signal. An output of an activation function regarding weighted inputs of artificial nodes included in the previous layer may be input to the artificial node via the links. The weighted input is a multiplication of an input (node value) of an artificial node by a weight, and the input corresponds to an axon value and the weight corresponds to a synaptic weight. The weight may be referred to as a parameter of the neural network 20. The activation function may include a sigmoid, a hyperbolic tangent (tanh), and a rectified linear unit (ReLU), and non-linearity may be formed in the neural network 20 by the activation function.

The output of any one node 22 included in the neural network 20 may be expressed as in Equation 1 below.

$$y_i = f\left(\sum_{j=1}^{m} w_{j,i} x_j\right)$$ Equation 1

Equation 1 may represent an output value $y_i$ of the i-th node 22 with respect to m input values in any layer. $x_j$ may denote an output value of the j-th node of a previous layer, and $w_{j,i}$ may denote an output value of the j-th node and a weight applied to the i-th node 22 of a current layer. f( ) may denote an activation function. As shown in Equation 1, an accumulated result of multiplications of the input value $x_j$ and the weight $w_{j,i}$ may be used with respect to the activation function. In other words, a MAC operation of multiplying and adding an appropriate input value $x_j$ and weight $w_{j,i}$ at a desired time point may be repeated. In addition to the above use, there are various application fields needing the MAC operation. To this end, a neuromorphic device capable of processing the MAC operation in an analog domain may be used.

Figure 3A:
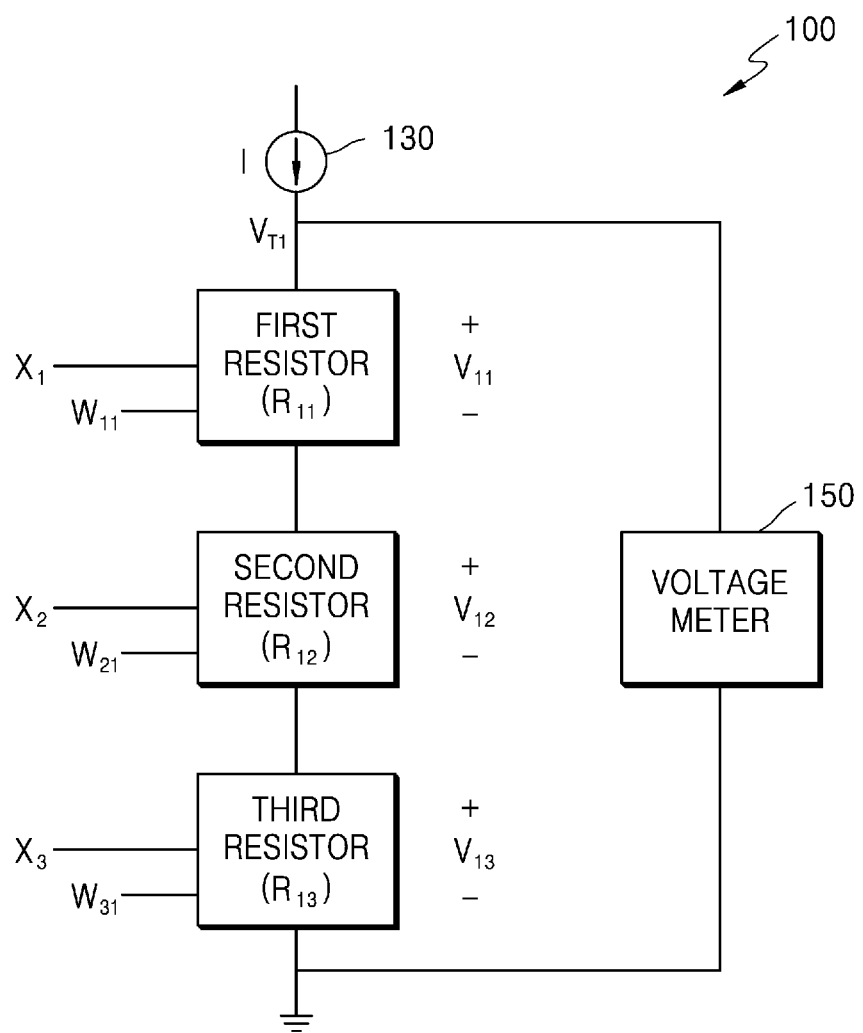
FIGS. 3A and 3B illustrate an example of a neuromorphic device.
Figure 3B:
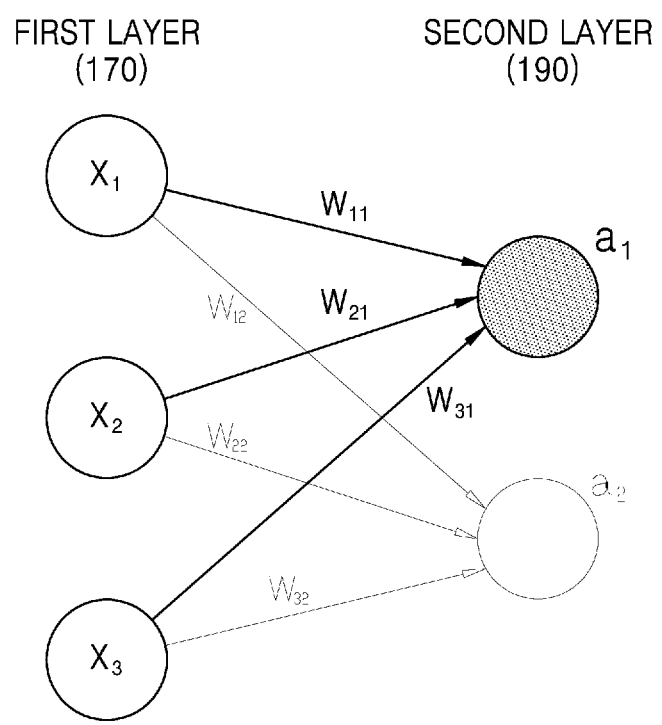

FIGS. 3A and 3B illustrate an example of a neuromorphic device 100.

FIG. 3A illustrates the architecture of the neuromorphic device 100 according to an example, and FIG. 3B exemplarily illustrates a neural network needing an operation to be performed by the neuromorphic device of FIG. 3A.

Referring to FIG. 3A, the neuromorphic device 100 may include a plurality of resistors, for example, first, second, and third resistors $R_{11}$, $R_{12}$, and $R_{13}$, that are serially connected to one another, a current source 130 that provides a current I applied to the first to third resistors $R_1$, $R_{12}$, and $R_{13}$, and a voltage meter 150 that measures a total voltage $V_{T1}$ of a resistor line in which the first to third resistors $R_{11}$, $R_{12}$, and $R_{13}$ are serially connected to one another. The total voltage $V_{T1}$ is a voltage of the sum of values of the voltage differences $V_{11}$, $V_{12}$, and $V_{13}$ between both terminals of the respective first to third resistors $R_{11}$, $R_{12}$, and $R_{13}$ included in the resistor line. Although the number of serially connected resistors is not particularly limited, the number may be 64 to 256. For convenience of explanation, a structure of three resistors, that is, the first to third resistors $R_{11}$, $R_{12}$, and $R_{13}$, that are serially connected to one another is described as an example.

Referring to FIG. 3B, a neural network in which a first layer 170 has three nodes and a second layer 190 has two nodes is illustrated as an example. The first layer 170 may be any one of the input layers and the hidden layers of FIG. 2. The second layer 190 may receive a value obtained by multiplying an output value by a weight of the first layer 170 and have, as a node value, a result value of inputting the received value to an activation function, and the node value may be provided to a next layer as an input. In detail, in a first node $a_1$ of the second layer 190, as in Equation 2, three multiplication operations of multiplying the output value of the first layer 170 by the weight corresponding to each link and an addition operation of summing multiplication result values are performed. For convenience of explanation, a description of the activation function is omitted.

$$a_1 = x_1 \cdot w_{11} + x_2 \cdot w_{21} + x_3 \cdot w_{31}$$ Equation 2:

The neuromorphic device 100 of FIG. 3A is a device that may be used for the operation of Equation 2. Referring to FIG. 3A, each of the first to third resistors $R_{11}$, $R_{12}$, and $R_{13}$ may have a different resistance value with respect to the current source 130. $R_{11}$ may be a first resistor corresponding to a first node of the first layer 170. Similarly, $R_{12}$ and $R_{13}$ may respectively be a second resistor corresponding to a second node of the first layer 170 and a third resistor corresponding to a third node of the first layer 170.

The resistance values of the first to third resistors $R_{11}$, $R_{12}$, and $R_{13}$ with respect to the current source 130 may be determined by inputs $x_1$, $x_2$, and $x_3$ and weights $w_{11}$, $w_{21}$, and $w_{31}$ that are respectively applied to the first to third resistors $R_{11}$, $R_{12}$, and $R_{13}$. The input $x_1$ may be an output value or a node value of the first node (the first layer 170) and an input applied to the first resistor $R_1$. Similarly, the input $x_2$ and the input $x_3$ may respectively refer to inputs or node values of the second node and the third node, and inputs applied to the second resistor $R_{12}$ and the third resistor $R_{13}$. In the weight $w_{11}$, "1" at the left denotes the first node of the first layer 170, and "1" at the right denotes the first node of the second layer 190. The weight $w_{11}$ is a weight to a link between the first node of the first layer 170 and the first node $a_1$ of the second layer 190, and is a weight applied to the first resistor $R_{11}$. Similarly, the weight $w_{21}$ and the weight $w_{31}$ are weights applied to the second resistor $R_{12}$ and the third resistor $R_{13}$, respectively.

A method of obtaining the sum of multiplications of inputs and weights by setting the resistance values of the first to third resistors $R_{11}$, $R_{12}$, and $R_{13}$ with respect to the current source 130 to have values that may represent the values obtained by multiplying the inputs $x_1$, $x_2$, and $x_3$ and the weights $w_{11}$, $w_{21}$, and $w_{31}$ respectively applied to the first to third resistors $R_1$, $R_{12}$, and $R_{13}$ is described below.

It is assumed that the inputs $x_1$, $x_2$, and $x_3$ each have a value of 1 or −1 and the weights $w_{11}$, $w_{21}$, and $w_{31}$ each have a value of 1 or −1 as well. The input value being 1 or −1 may indicate that the input applied to each of the node values or the first to third resistors $R_1$, $R_{12}$, and $R_{13}$ of the first layer 170 is 1 or −1. The weights $w_{11}$, $w_{21}$, and $w_{31}$ being 1 or −1 may indicate that the weight assigned to a link between each node of the first layer 170 and each node of the second layer 190 or the weight applied to each of the first to third resistors $R_{11}$, $R_{12}$, and $R_{13}$ is −1 or 1. The weights $w_{11}$, $w_{21}$, and $w_{31}$ may be values determined through training, or values altered to meet conditions such as the structure of a neural network, the type of an input, etc.

As the multiplication of the inputs $x_1$, $x_2$, and $x_3$ and the weights $w_{11}$, $w_{21}$, and $w_{31}$ may have a value of 1 or −1, the first to third resistors $R_{11}$, $R_{12}$, and $R_{13}$ are configured to have two resistance values different from each other. In other words, when one resistance value may be set to correspond to a multiplication of an input by a weight that is 1, another resistance value may be set to correspond to a multiplication of an input by a weight that is −1. Various devices capable of changing a resistance value, for example, a phase change device, a magnetic tunnel junction (MTJ) device, etc., may be used as the resistor.

For example, cases in which the resistance value of each of the first to third resistors $R_{11}$, $R_{12}$, and $R_{13}$ is 20 (when a multiplication of an input by a weight is 1, and the resistance value of each of the first to third resistors $R_{11}$, $R_{12}$, and $R_{13}$ is 5 (when a multiplication of an input by a weight is −1, are described as examples. When the weight $w_{11}$ and the input $x_1$ with respect to the first resistor $R_{11}$ are both 1, a multiplication of the input $x_1$ by the weight $w_{11}$ is 1. Accordingly, the first resistor $R_{11}$ may be set to have a resistance value of 20) with respect to the current source 130. Alternatively, when the weight $w_{11}$ with respect to the first resistor $R_{11}$ is −1 and 1 is applied as the input $x_1$, a multiplication of the input $x_1$ by the weight $w_{11}$ is −1. Accordingly, the first resistor $R_{11}$ may be set to have a resistance value of 5) with respect to the current source 130. The above relationship between the inputs $x_1$, $x_2$, and $x_3$ and the weights $w_{11}$, $w_{21}$, and $w_{31}$, and the resistance values of the first to third resistors $R_{11}$, $R_{12}$, and $R_{13}$, may be summarized in Table 1 below.

TABLE 1

| Input | Weight | Input * Weight | Resistance Value (Ω) |
|---|---|---|---|
| 1 | 1 | 1 | 20 |
| 1 | −1 | −1 | 5 |
| −1 | 1 | −1 | 5 |
| −1 | −1 | 1 | 20 |

In a case in which the inputs $x_1$, $x_2$, and $x_3$ and the weights $w_{11}$, $w_{21}$, and $w_{31}$ with respect to the first to third resistors $R_{11}$, $R_{12}$, and $R_{13}$ are as shown in Table 2, a method of operating the neuromorphic device 100 is described below.

TABLE 2

| Resistor | Input | Weight |
|---|---|---|
| First resistor $R_{11}$ | $x_1 = 1$ | $w_{11} = 1$ |
| Second Resistor $R_{12}$ | $x_2 = 1$ | $w_{21} = -1$ |
| Third Resistor $R_{13}$ | $x_3 = -1$ | $w_{31} = -1$ |

In the first resistor $R_{11}$, as 1 is applied as the input $x_1$ while the weight $w_{11}$ is set to 1, a multiplication of the input $x_1$ by the weight $w_{11}$ is 1·1=1. Accordingly, referring to Table 1, the resistance value of the first resistor $R_{11}$ with respect to the current source 130 is determined to be 20Ω. In the second resistor $R_{12}$, as 1 is applied as the input $x_2$ while the weight $w_{21}$ is set to −1, a multiplication of the input $x_2$ by the weight $w_{21}$ is 1·-1=−1. Accordingly, the resistance value of the second resistor $R_{12}$ with respect to the current source 130 is determined to be 5Ω. In the third resistor $R_{13}$, as −1 is applies as the input $x_3$ while the weight $w_{31}$ is set to −1, a multiplication of the input $x_3$ by the weight $w_{31}$ is −1·-1=1. Accordingly, the resistance value of the third resistor $R_{13}$ with respect to the current source 130 is determined to be 20Ω.

When the resistance values of the first to third resistors $R_{11}$, $R_{12}$, and $R_{13}$ with respect to the current source 130 are determined depending on the inputs $x_1$, $x_2$, and $x_3$ and the weights $w_{11}$, $w_{21}$, and $w_{31}$, a current having a specific current value, for example, 1 A, flows by using the current source 130 in a line in which the first to third resistors $R_{11}$, $R_{12}$, and $R_{13}$ are serially connected, and a voltage difference generated due to the current is measured by using the voltage meter 150. When a 1 A current flows, a voltage difference is generated as much as the resistance value at both terminals of each of the first to third resistors $R_{11}$, $R_{12}$, and $R_{13}$ according to Ohm's law (V=I*R). In this state, when a total voltage of the resistor line, that is, a voltage difference $V_{T1}$ between the lower terminal of the third resistor $R_{13}$ and the upper terminal of the first resistor $R_{11}$, is measured, a voltage difference of the sum of the voltage differences applied to the respective first to third resistors $R_1$, $R_{12}$, and $R_{13}$ may be obtained. Furthermore, as the intensity of a current, for example, 1 A, is already known, the sum of the resistance values set to the respective first to third resistors $R_1$, $R_{12}$, and $R_{13}$ that are serially connected to one another may be obtained from the sum of the resistance values, and the sum of multiplications of inputs and weights applied to the respective first to third resistors $R_{11}$, $R_{12}$, and $R_{13}$ may be obtained therefrom. In other words, a synthetic resistance value may be obtained from a measurement value of the total voltage $V_{T1}$ of the resistor line through Ohm's law (V=IR), and the synthetic resistance value may be the same as the sum of the resistance values of the respective first to third resistors $R_{11}$, $R_{12}$, and $R_{13}$ that are serially connected to one another. Furthermore, each resistance value represents a multiplication of an input by a weight applied to each of the first to third resistors $R_{11}$, $R_{12}$, and $R_{13}$, the sum of multiplications of inputs and weights applied to the respective first to third resistors $R_{11}$, $R_{12}$, and $R_{13}$ may be obtained from the total voltage difference. The relationship between the total voltage and the sum of multiplications of inputs and weights may be summarized in Table 3 below.

TABLE 3

| Total Voltage (V) | Sum of Multiplications of Inputs and Weights |
|---|---|
| 15 | −3 |
| 30 | −1 |
| 45 | 1 |
| 60 | 3 |

When the total voltage according to the current of 1 A is 45 V, referring to Table 3, the sum of multiplications of inputs and weights is 1. Alternatively, when the total voltage measured when another weight and another input are applied is 15 V, even when the applied input and weight are unknown, it may be seen that the sum of multiplications is −3 A relationship of the input and the weight, and the current and the voltage, with respect to each of the first to third resistors $R_{11}$, $R_{12}$, and $R_{13}$ according to Table 1 and Table 2, may be summarized in Table 4 below

TABLE 4

|  | Input | Weight | Input * Weight | Resistance (Ω) | Current (A) | Voltage (V) |
|---|---|---|---|---|---|---|
| First Resistor $R_{11}$ | 1 | 1 | 1 | 20 | 1 | 20 |
| Second Resistor $R_{12}$ | 1 | −1 | −1 | 5 | 1 | 5 |
| Third Resistor $R_{13}$ | −1 | −1 | 1 | 20 | 1 | 20 |
| Resistor Line | n/a | n/a | n/a | 45 | 1 | 45 |

Figure 4:
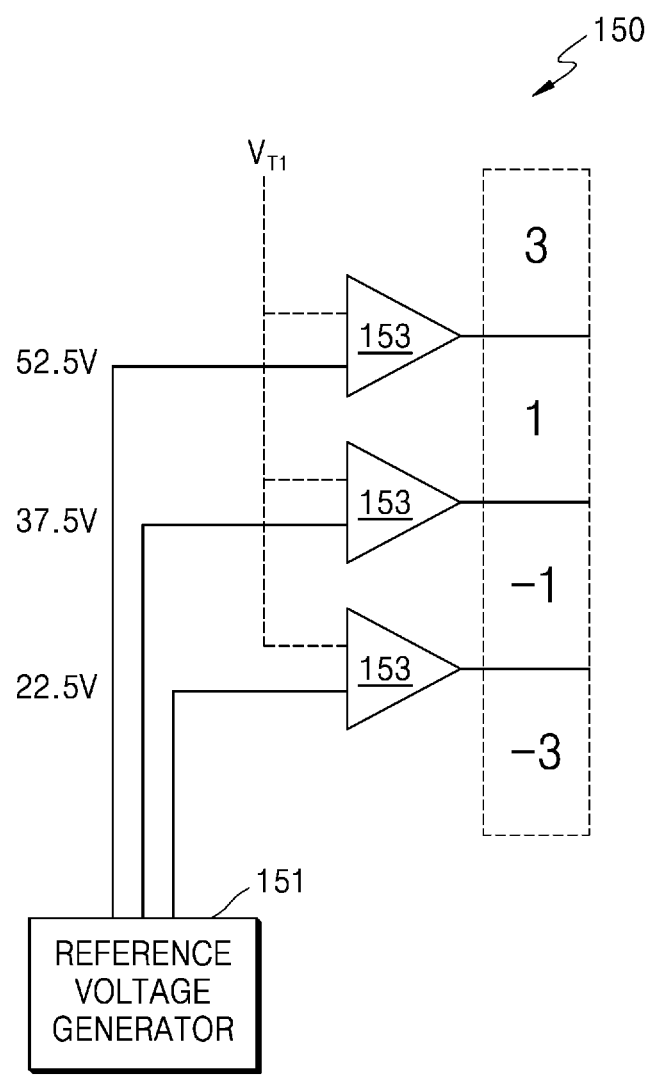
FIG. 4 illustrates the structure and operation of a voltage meter applied to the neuromorphic device of FIG. 3A.

FIG. 4 illustrates the structure and operation of a voltage meter applied to the neuromorphic device 100 of FIG. 3A.

Referring to FIG. 4, a method of obtaining the sum of multiplications of the inputs and the weights applied to each of the first to third resistors $R_{11}$, $R_{12}$, and $R_{13}$ of FIG. 3A, which is performed by the voltage meter 150, is described as an example.

The voltage meter 150 may include a reference voltage generator 151 and comparators 153, and is operated in a method of finding a section to which a measured voltage belongs by comparing whether a voltage to measure is higher or lower than reference voltages. The voltage meter 150 may be implemented by an analog-to-digital converter (ADC) or a multi-level sense amplifier (MLSA), but the configuration is not limited thereto.

The voltage meter 150 of FIG. 4 may include the reference voltage generator 151 that provides three reference voltages, for example, 22.5 V, 37.5 V, and 52.5 V, and the three comparators 153 that output a result of the comparison between the reference voltage and a measured voltage. However, figures of the reference voltages are arbitrary figures for convenience of explanation, and the reference voltages are not limited thereto and may be set to other figures. To measure the total voltage $V_{T1}$ applied to the resistor line, a circuit may be configured such that the total voltage $V_{T1}$ is applied to one input terminal of each of the comparators 153, and a different reference voltage, for example, 22.5 V, 37.5 V, and 52.5 V, provided by the reference voltage generator 151, is applied to the other input terminal of each of the comparators 153. A section corresponding to the total voltage $V_{T1}$ may be classified into four sections by using the comparators 153 of FIG. 4. In detail, the section may be classified into a first section in which the total voltage $V_{T1} \geq 52.5$ V, a second section in which 52.5 V>$V_{T1} \geq 37.5$ V, a third section in which 37.5 V>$V_{T1} \geq 22.5$ V, and a fourth section in which 22.5 V>$V_{T1}$.

It may be determined on the basis of a measurement result of the total voltage $V_{T1}$ to which one of the sections the output of the voltage meter 150 belongs, and the sum of multiplications of inputs and weights may be output. For example, when the measured total voltage $V_{T1}$ belongs to the first section, 3 may be output as a result value, and when the measured total voltage $V_{T1}$ belongs to the second section, 1 may be output as a result value. The above descriptions may be summarized in Table 5 below. A voltage range of each section depends on the intensity of a current being applied and the resistance value of a resistor. Accordingly, the range of a voltage for each section may vary depending on the current being applied and the resistance.

When the measured total voltage $V_{T1}$ is 45 V, as the measured total voltage $V_{T1}$ belongs to the second section, referring to Table 5, the voltage meter 150 outputs a result value of 1. The result value 1 is the same as the sum of multiplications of inputs and weights applied to each of the first to third resistors $R_{11}$, $R_{12}$, and $R_{13}$. The output value of the voltage meter 150 may be a digital value, or a binary number. For example, when the output value of the voltage meter 150 is 3, a binary number "11" may be output. The output value may include a binary number including a separate sign bit indicating a sign.

TABLE 5

| Section | Voltage Range | Sum of Input * Weight |
|---|---|---|
| First Section | $V_T \geq 52.5$ V | 3 |
| Second Section | 52.5 V > $V_T \geq 37.5$ V | 1 |
| Third Section | 37.5 V > $V_T \geq 22.5$ V | −1 |
| Fourth Section | 22.5 V > $V_T$ | −3 |

Figure 5A:
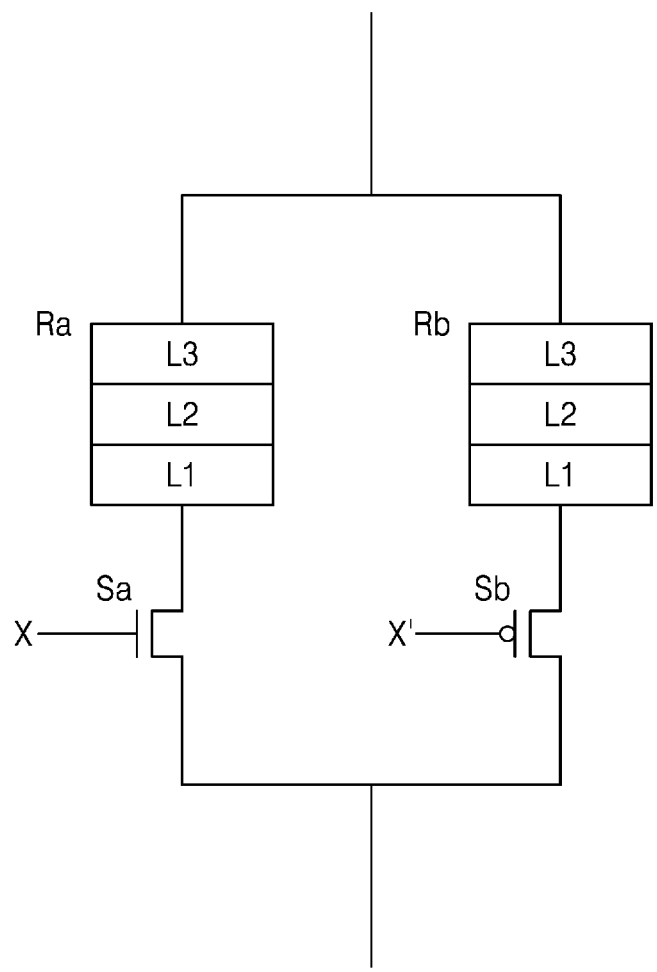
FIGS. 5A, 5B, and 5C illustrate the structure and operation of a resistor applied to the neuromorphic device of FIG. 3A.
Figure 5B:
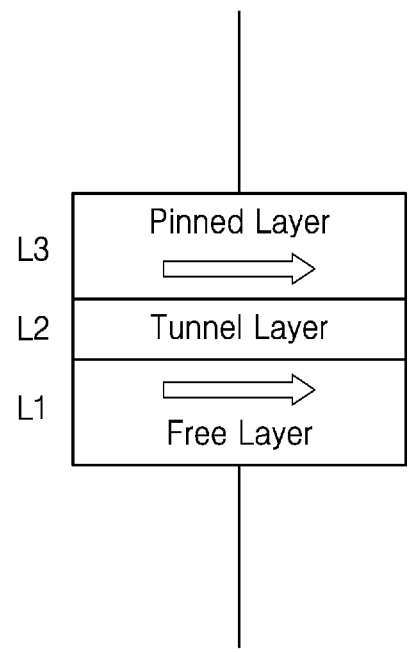
Figure 5C:
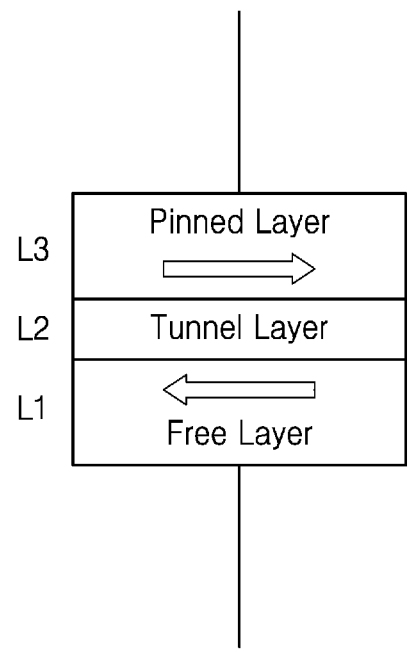

FIGS. 5A to 5C illustrate the structure and operation of a resistor applied to the neuromorphic device 100 of FIG. 3A.

Referring to FIG. 5A, the structure of a resistor is described below. The resistive memory cell of FIG. 5A may include a pair of variable resistors Ra and Rb including MTJ devices connected in parallel and a pair of transistors Sa and Sb respectively serially connected to the variable resistors Ra and Rb. A variable resistors implemented by a MTJ may have a resistance value that varies according to the intensity and direction of a provided current (or voltage) and may exhibit a non-volatile feature of keeping the resistance value unchanged even when the input current (or voltage) is cut off.

The MTJ device may include a pinned layer L3, a free layer L1, and a tunnel layer L2 therebetween. A magnetization direction of the pinned layer L3 is fixed, and a magnetization direction of the free layer L1 may be the same as or different from the magnetization direction of the pinned layer L3 according to conditions. To fix the magnetization direction of the pinned layer L3, for example, a layer for forming an anti-ferromagnetic layer and/or a synthetic anti-ferromagnetic layer may be further provided.

The magnetization direction of the free layer L1 may be changed by an electrical/magnetic factor provided inside and/or outside the resistive memory cell. The free layer L1 may include a material having a changeable magnetization direction, for example, a ferromagnetic material. The free layer L1 may include, for example, CoFeB, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof.

The tunnel layer L2 may have a thickness thinner than a spin diffusion distance and may include a non-magnetic material, for example, oxides of magnesium (Mg), titanium (Ti), aluminum (Al), magnesium-zinc (MgZn), and magnesium-boron (MgB), titanium (Ti), vanadium (V), and/or a combination thereof.

The pinned layer L3 may have a magnetization direction fixed by the anti-ferromagnetic layer. The pinned layer L3 may include a ferromagnetic material, for example, CoFeB, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof.

As described above, to fix the magnetization direction of the pinned layer L3, the MTJ device may further include an anti-ferromagnetic layer and/or a synthetic anti-ferromagnetic layer. The anti-ferromagnetic layer may include an anti-ferromagnetic material, for example, PtMn, IrMn, MnO, MnS, MnTe, $MnF_2$, $FeC_{12}$, FeO, $CoC_{12}$, CoO, $NiC_{12}$, NiO, Cr, and/or a combination thereof. The synthetic anti-ferromagnetic layer may include a spacer including Cu, Ru, Ir, and/or a combination thereof and a pinned layer having strong magnetic anisotropy. The pinned layer may include an alloy or multilayer of a ferromagnetic material such as Co, Ni, Fe, etc., an anti-ferromagnetic material such as Pt, Pd, Cr, Ir, etc.

FIGS. 5B and 5C illustrate the magnetization direction of the MTJ device according to data stored in the resistor of FIG. 5A.

The resistance value of the MTJ device may vary according to the magnetization direction of the free layer L1. The intensity of a write current for varying the magnetization direction of the free layer L1 may be much greater than the intensity of a driving current. When the magnetization direction of the free layer L1 is determined such that the MTJ device has a specific resistance value, the direction may be determined by supplying a write current. Then, a driving current (or read current) provided to use or read the resistance value of the MTJ device may be much smaller than the write current so as not to change the magnetization direction of the free layer L1 that is already determined.

FIG. 5B illustrates that the magnetization directions of the free layer L1 and the pinned layer L3 are parallel to each other in the MTJ device. When the magnetization directions are parallel as above, the MTJ device may have a low resistance value, for example, a resistance value of 5Ω. FIG. 5C illustrates that the magnetization directions of the free layer L1 and the pinned layer L3 in the MTJ device are anti-parallel to each other. When the magnetization directions are anti-parallel as above, the MTJ device may have a high resistance value, for example, a resistance value of 20Ω.

Figure 6:
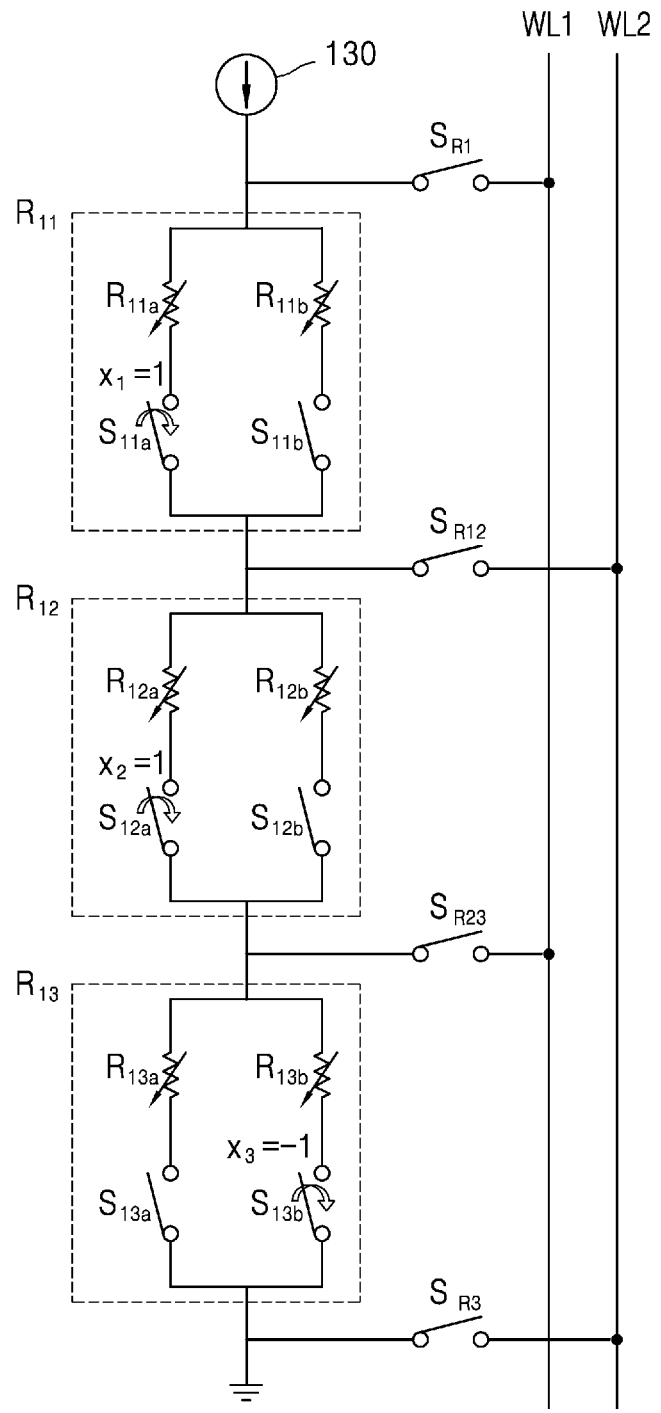
FIG. 6 illustrates the structure and operation to set a weight to the resistor of the neuromorphic device of FIG. 3A.

FIG. 6 illustrates the structure and operation to set a weight to the resistor of the neuromorphic device 100 of FIG. 3A.

In the following description, a method of applying a weight and an input to the resistor included in the neuromorphic device 100 of FIG. 3A is described in detail with reference to FIG. 6.

Referring to FIG. 6, each of the first to third resistors $R_{11}$, $R_{12}$, and $R_{13}$ may have a structure including a pair of variable resistors connected in parallel, and a pair of switches serially connected to each of the variable resistors. For convenience of explanation, the variable resistance device of FIG. 6 may have a resistance value of 20Ω or 5Ω depending on the direction of a voltage applied between both terminals thereof. In detail, each of variable resistors $R_{11a}$, $R_{11b}$, $R_{12a}$, $R_{12b}$, $R_{13a}$, and $R_{13b}$ may be set to have a resistance value of 20 Ω when an electric potential over a certain level greater than a level of a second terminal is applied to a first terminal, but a resistance value of 5 Ω when an electric potential over a certain level greater than a level of the first terminal is applied to the second terminal. For example, referring to FIG. 6, when +100 V is applied to both terminals of a first variable resistor $R_{11a}$ of the first resistor $R_{11}$, the first variable resistor $R_{11a}$ is set to 20Ω. However, when −100 V is applied to both terminals of the first variable resistor $R_{11a}$ of the first resistor $R_{11}$, the first variable resistor $R_{11a}$ is set to 5Ω.

In the present example, a pair of variable resistors included in one resistor may be complementarily set to have different values. For example, when the first variable resistor $R_{11a}$ is set to 20Ω, the second variable resistor $R_{11b}$ may be set to 5Ω, and when the first variable resistor $R_{11a}$ is set to 5Ω, the second variable resistor $R_{11b}$ may be set to 20Ω.

Whether to set the first variable resistor $R_{11a}$ to 20Ω or 5Ω may be determined by a weight value applied to the first resistor $R_{11}$. When the weights $w_{11}$, $w_{21}$, and $w_{31}$ to be applied to the first resistor $R_{11}$ is 1 or −1, and a weight applied to the first resistor $R_{11}$ is 1, the first variable resistor $R_{11a}$ may be set to have 20Ω. In this state, as the second variable resistor $R_{11b}$ is complementarily set to the first variable resistor $R_{11a}$, the second variable resistor $R_{11b}$ is set to 5Ω. Similarly, when the weight $w_{11}$ applied to the first resistor $R_{11}$ is −1, the first variable resistor $R_{11a}$ may be set to 5Ω, and the second variable resistor $R_{11b}$ may be set to 20 Ω complementary to the first variable resistor $R_{11a}$.

In the second resistor $R_{12}$ and the third resistor $R_{13}$, as in the first resistor $R_{11}$, when the applied weight is 1, the first variable resistors $R_{12a}$ and $R_{13a}$ may be set to 20Ω, and the second variable resistors $R_{12b}$ and $R_{13b}$ may be set to 5Ω. Furthermore, when the applied weight is −1, the first variable resistors $R_{12a}$ and $R_{13a}$ may be set to 5Ω, and the second variable resistors $R_{12b}$ and $R_{13b}$ may be set to 20Ω.

A pair of switches included in one resistor may be designed to complementarily operate depending on the inputs $x_1$, $x_2$, and $x_3$ respectively applied to of the first to third resistors $R_{11}$, $R_{12}$, and $R_{13}$. In detail, when first switches $S_{11a}$, $S_{12a}$, and $S_{13a}$ are closed, second switches $S_{11b}$, $S_{12b}$, and $S_{13b}$ may be designed to be opened, and when the first switches $S_{11a}$, $S_{12a}$, and $S_{13a}$ are opened, the second switches $S_{11b}$, $S_{12b}$, and $S_{13b}$ may be designed to be closed. As the above switches, not limited through, may be implemented in various methods through a metal oxide semiconductor field effect transistor (MOSFET) and a simple circuit, a detailed description about a structure of the switches that complementarily operate is omitted.

Which switch would be opened or closed may be determined by the inputs $x_1$, $x_2$, and $x_3$ respectively applied to the first to third resistors $R_{11}$, $R_{12}$, and $R_{13}$. The input applied to each of the first to third resistors $R_{11}$, $R_{12}$, and $R_{13}$ may be 1 or −1. When the input is 1, it may be configured such that the first switches $S_{11a}$, $S_{12a}$, and $S_{13a}$ may be closed and the second switches $S_{11b}$, $S_{12b}$, and $S_{13b}$ may be opened. Similarly, when the input applied to each of the first to third resistors $R_{11}$, $R_{12}$, and $R_{13}$ is −1, it may be configured such that the first switches $S_{11a}$, $S_{12a}$, and $S_{13a}$ are opened and the second switches $S_{11b}$, $S_{12b}$, and $S_{13b}$ are closed.

In addition, when the input of the first resistor $R_{11}$ is 1, the circuit may be designed such that the first switch $S_{11a}$ is closed and the second switch $S_{11b}$ is opened to allow a current flow in the first variable resistor $R_{11a}$. In contrast, when the input $x_1$ to the first resistor $R_{11}$ is −1, the circuit may be designed such that the second switch $S_{11b}$ is closed and the first switch $S_{11a}$ is opened to allow a current flow in the second resistor $R_{11b}$. The second resistor $R_{12}$ and the third resistor $R_{13}$, like the first resistor $R_{11}$, may be configured such that the first switches $S_{12a}$ and $S_{13a}$ are closed and the second switches $S12_{12b}$ and $S_{13b}$ are opened when the applied inputs $x_2$ and $x_3$ are 1, and the first switches $S_{12a}$ and $S_{13a}$ are opened and the second switches $S12_{12b}$ and $S_{13b}$ are closed when the applied inputs $x_2$ and $x_3$ are −1.

The circuit structure illustrated in FIG. 6 may correspond to a partial circuit design provided in the neuromorphic device 100. Accordingly, the neuromorphic device 100 may include the circuit structures described in FIG. 6, and the respective circuit structures may be implemented to be connected to each other and combined with each other in the neuromorphic device 100.

Figure 7:
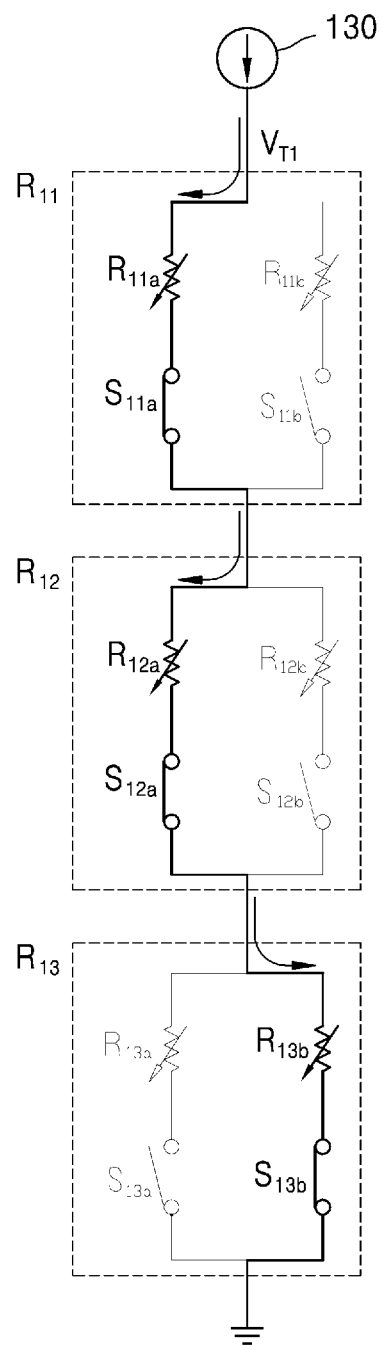
FIG. 7 illustrates the flow of a current when an input and a current are applied to the neuromorphic device of FIG. 3A.

FIG. 7 illustrates the flow of a current when an input and a current are applied to the neuromorphic device of FIG. 3A.

In the following description, referring to FIGS. 6 and 7, a process of calculating the sum of multiplications of the inputs $x_1$, $x_2$, and $x_3$ and the weights $w_{11}$, $w_{21}$, and $w_{31}$ is described.

First, a weight to be applied to each resistor is set. Referring to an example of Table 4, the weight $w_{11}$ applied to the first resistor $R_{11}$ is 1, the weight $w_{21}$ applied to the second resistor $R_{12}$ is −1, and the weight $w_{31}$ applied to the third resistor $R_{13}$ is −1.

As the weight $w_{11}$ applied to the first resistor $R_{11}$ is 1, as described above, the first variable resistor $R_{11a}$ of the first resistor $R_{11}$ is set to 20Ω, and the second variable resistor $R_{11b}$ is set to 5Ω. When the first variable resistor $R_{11a}$ is 5Ω, and the second variable resistor $R_{11b}$ is set to 20Ω, a resistance value may be changed. To set and check the resistance values of the variable resistors $R_{11a}$ and $R_{11b}$, a first weight line WL1 and a second weight line WL2 are provided at a side of the resistor line. First, when an electric potential that is 100 V greater than an electric potential of the second weight line WL2 is applied to the first weight line WL1 while switches $S_{11a}$, $S_{11a}$, $S_{R1}$, and $S_{R12}$ are closed, a voltage V1 of +100 V is applied to both terminals of the first variable resistor $R_{11a}$, and the first variable resistor $R_{11a}$ is set to 20 Ω due to a current by the voltage V1. The driving of a switch and the application of a voltage/current to set a weight may be performed by a separate weight controller. Similarly, when an electric potential that is 100 V lower than a voltage applied to the second weight line WL2 is applied to the first weight line WL1 while the switches $S_{11a}$, $S_{R1}$, and $S_{R12}$ are closed, a voltage V1—100 V is applied to both terminals of the second variable resistor $R_{11b}$, and the second variable resistor $R_{11b}$ is set to 5Ω.

A process of checking whether the variable resistor of the resistor is appropriately set may be additionally performed. For example, a resistance value set to the first variable resistor $R_{11a}$ may be checked by a method of measuring a voltage generated in the first weight line WL1 by allowing a specific current (test current) to flow in the first weight line WL1 while the switches $S_{11a}$, $S_{R1}$, and $S_{R12}$ are closed and the second weight line WL2 is grounded. Similarly, a resistance value of the second variable resistor $R_{11b}$ may be checked by a method of measuring a voltage generated in the first weight line WL1 by allowing a test current to flow in the first weight line WL1 while the switches $S_{11a}$, $S_{R1}$, and $S_{R12}$ are closed and the second weight line WL2 is grounded.

When the setting of the weight $w_{11}$ of the first resistor $R_{11}$ is completed, the weight $w_{21}$ of the second resistor $R_{12}$ may be set. As the weight $w_{21}$ applied to the second resistor $R_{12}$ is −1, the first variable resistor $R_{12a}$ of the second resistor $R_{12}$ is set to 5Ω, and the second variable resistor $R_{12b}$ is set to 20Ω. When the first variable resistor $R_{12a}$ is set to 20 Ω and the second variable resistor R12$_b$ is set to 5Ω, the setting of a variable resistor may be changed. As a method of changing a resistance value of a variable resistor is similar to the method in the first resistor $R_{11}$, a detailed description thereof is omitted. During a weight setting test of the second resistor $R_{12}$, a voltage of the second weight line WL2 may be measured by allowing the first weight line WL1 to be grounded and a test current to flow in the second weight line WL2. When the setting of the weight $w_{21}$ in the second resistor $R_{12}$ is completed, the weight $w_{31}$ of the third resistor $R_{13}$ is set. As the weight $w_3$, applied to the third resistor $R_{13}$ is −1, the first variable resistor $R_{13a}$ of the third resistor $R_{13}$ is set to 5Ω, and the second variable resistor $R_{13b}$ is set to 20Ω. As the setting method is similar to the method in the first resistor, a detailed description thereof is omitted. The resistance values of the above-described resistors may be summarized in Table 6 below.

TABLE 6

| Resistor | Weight | Variable Resistance | Resistance Value (Ω) |
| --- | --- | --- | --- |
| First Resistor $R_{11}$ | 1 | First Variable Resistance $R_{11a}$ | 20 |
| | | Second Variable Resistance $R_{11b}$ | 5 |
| Second Resistor $R_{12}$ | −1 | First Variable Resistance $R_{12a}$ | 5 |
| | | Second Variable Resistance $R_{12b}$ | 20 |
| Third Resistor $R_{13}$ | −1 | First Variable Resistance $R_{13a}$ | 5 |
| | | Second Variable Resistance $R_{13b}$ | 20 |

When the setting of the weights $w_{11}$, $w_{21}$, and $w_{31}$ of the first to third resistors $R_{11}$, $R_{12}$, and $R_{13}$ is completed, the inputs $x_1$, $x_2$, and $x_3$ are applied to the first to third resistors $R_{11}$, $R_{12}$, and $R_{13}$. Referring to FIG. 6, as the input $x_1$ to the first resistor $R_{11}$ is 1, the first switch $S_{11a}$ is closed and the second switch $S_{11b}$ is opened. Similarly, as the input $x_2$ to the second resistor $R_{12}$ is 1, the first switch $S_{12a}$ is closed and the second switch $S_{12b}$ is opened. Furthermore, as the input $x_3$ to the third resistor $R_{13}$ is −1, the first switch $S_{13a}$ is opened and the second switch $S_{13b}$ is closed.

When the application of the weights $w_{11}$, $w_{21}$, and $w_3$, and the inputs $x_1$, $x_2$, and $x_3$ to each of the first to third resistors $R_{11}$, $R_{12}$, and $R_{13}$ is completed, a constant current, for example, a 1 A current, is applied to the resistor line from the current source 130. As illustrated in FIG. 7, the applied current flows through the first variable resistor $R_{11a}$ of the first resistor $R_{11}$, the first variable resistor $R_{12a}$ of the second resistor $R_{12}$, and the second variable resistor $R_{13b}$ of the third resistor $R_{13}$. Then, a total voltage generated in the resistor line due to the current is measured. The total voltage may be calculated by using Ohm's law and Equation 3. In this state, the resistance and voltage drop due to the switches and wirings are very small values, which may be ignored.

$$V_{T1}=I_1*R_{11a}+I_1*R_{12a}+I_1*R_{13b} \qquad \text{Equation 3:}$$

In Equation 3, as $I_1$ is 1 A, and $R_{11a}$, $R_{12a}$, and $R_{13b}$ are 20Ω, 5Ω, and 20Ω, respectively, $V_{T1}$ may be calculated to be 45 V. It may be seen that the sum of multiplications of inputs and weights applied to the resistor line is 1 by measuring the total voltage $V_{T1}$ using the voltage meter 150 of FIG. 4 and identifying that the measured voltage corresponds to the second section with reference to Table 5.

Figure 8A:
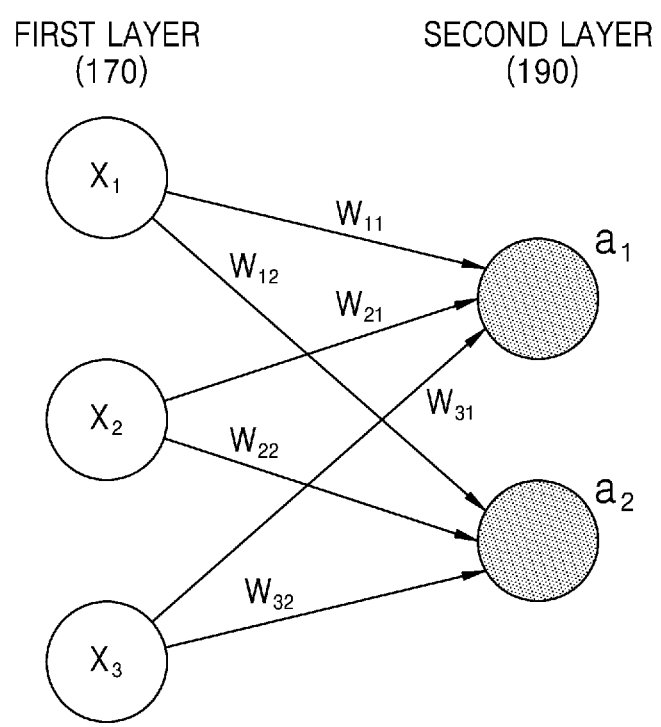
FIGS. 8A and 8B illustrate an example of the structure and operation of a neuromorphic device in which the same input is applied to two-row resistor lines.
Figure 8B:
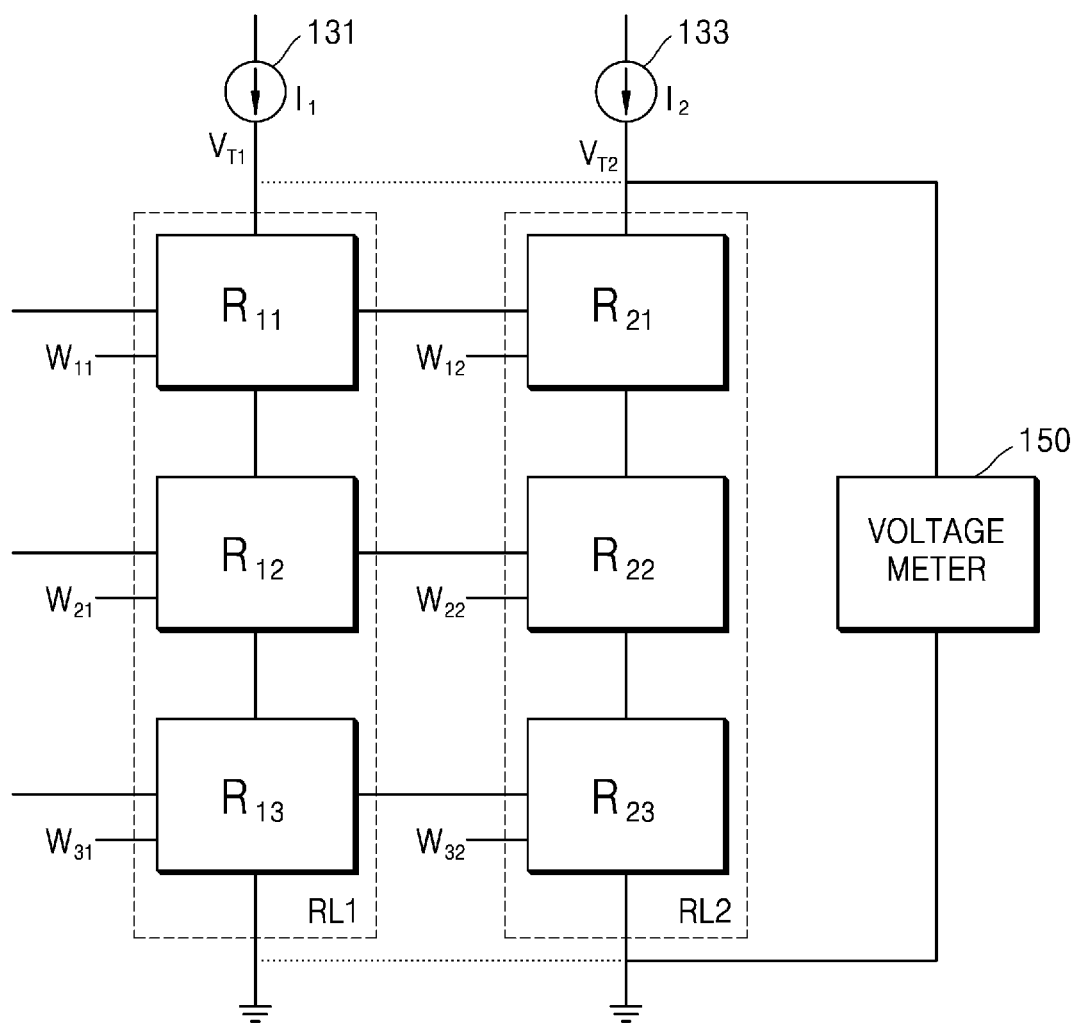

FIGS. 8A and 8B illustrate an example of the structure and operation of a neuromorphic device in which the same input is applied to two-row resistor lines.

In the following description, referring to FIGS. 8A and 8B, a structure and operation method of a neuromorphic device that operates with respect to inputs and weights applied to two nodes is described as an example.

In FIG. 8A, a neural network in which the first layer 170 has three nodes and the second layer 190 has two nodes is illustrated as an example. In the first node $a_1$ of the second layer 190, as in Equation 2, three multiplication operations of multiplying the inputs $x_1$, $x_2$, and $x_3$ from the first layer 170 by the weights $w_{11}$, $w_{21}$, and $w_{31}$ thereof, and an addition operation of summing multiplication result values, may be performed. Similarly, in a second node $a_2$ of the second layer 190, as in Equation 4, three multiplication operations of multiplying the inputs $x_1$, $x_2$, and $x_3$ from the first layer 170 by weights $w_{12}$, $w_{22}$, and $w_{32}$ thereof, and an addition operation of summing multiplication result values, may be performed.

$$a_2 = x_1 \cdot w_{12} + x_2 \cdot w_{22} + x_3 \cdot w_{32} \qquad \text{Equation 4:}$$

As a method of driving a neuromorphic device used for the operation performed in the first node $a_1$ is described above in detail, a redundant description thereof is omitted.

Referring to FIG. 8B, two-row resistor lines including first and second resistor lines RL1 and RL2 are provided. The first resistor line RL1 may perform an operation for the first node $a_1$, and the second resistor line RL2 may perform an operation for the second node $a_2$. As illustrated, it may be configured such that the same input is applied to resistors disposed in the same row. For example, although the weights applied to the first resistor $R_{11}$ of the first resistor line RL1 and a first resistor $R_{21}$ of the second resistor line RL2 are different from each other, the same input may be applied thereto. The voltage meter 150 may be separately disposed at each resistor line, or may be configured to measure voltages of the first resistor line RL1 and the second resistor line RL2 by using only one voltage meter with a time difference. FIG. 8B illustrates an example of using one voltage meter 150. Furthermore, FIG. 8B illustrates an example in which current sources 131 and 133 are respectively separately disposed at the first resistor line RL1 and the second resistor line RL2, but the configuration is not limited thereto and a structure of sequentially applying a current to the first resistor line RL1 and the second resistor line RL2 with one current source may be used.

Figure 9:
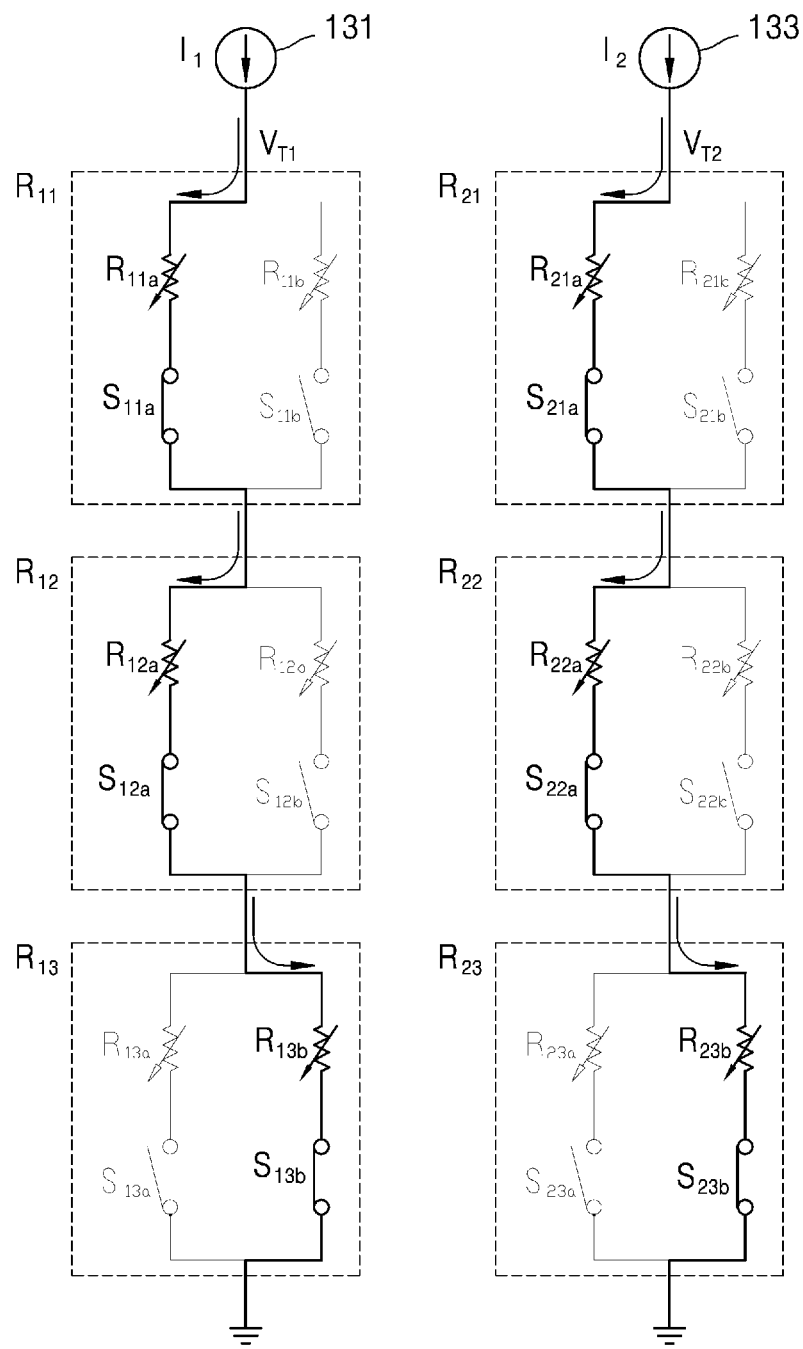
FIG. 9 illustrates an operation when a current is applied to the neuromorphic device of FIG. 8B.

FIG. 9 illustrates an operation when a current is applied to the neuromorphic device of FIG. 8B.

In the following description, an operation of the neuromorphic device of FIG. 8B is described with reference to FIG. 9. For convenience of explanation, the inputs $x_1$, $x_2$, and $x_3$ and the weights $w_{11}$, $w_{21}$, and $w_{31}$, which are related to the first resistor line RL1, are the same as those in Table 2. An example is described, in which the inputs $x_1$, $x_2$, and $x_3$ related to the second resistor line RL2 are in common with the inputs of the first resistor line RL1, and the weights $w_{12}$, $w_{22}$, and $w_{32}$ of the second resistor line RL2 are such that $w_{12} = -1$, $w_{22} = -1$, and $w_{32} = 1$.

First, weights are set to the first resistor line RL1 and the second resistor line RL2. The setting of variable resistors included in the first resistor line RL1 is described above and is the same as that in Table 6. A method of setting the variable resistors included in the second resistor line RL2 is the same as the above-described method and may be summarized in Table 7 below.

TABLE 7

| Second Resistor Line RL2 | Weight | Variable Resistance | Resistance Value (Ω) |
|---|---|---|---|
| First Resistor $R_{21}$ | $W_{12} = -1$ | First Variable Resistance $R_{21a}$ | 5 |
| | | Second Variable Resistance $R_{21b}$ | 20 |
| Second Resistor $R_{22}$ | $W_{22} = -1$ | First Variable Resistance $R_{22a}$ | 5 |
| | | Second Variable Resistance $R_{22b}$ | 20 |
| Third Resistor $R_{23}$ | $W_{32} = 1$ | First Variable Resistance $R_{23a}$ | 20 |
| | | Second Variable Resistance $R_{23b}$ | 5 |

When the setting of weights to the first resistor line RL1 and the second resistor line RL2 is completed, the inputs $x_1$, $x_2$, and $x_3$ may be simultaneously or sequentially applied to the first resistor line RL1 and the second resistor line RL2. The inputs $x_1$, $x_2$, and $x_3$ may be applied to the first resistor line RL1 and the second resistor line RL2 by operating the switches included in the first resistor line RL1 and the second resistor line RL2, and an operating method of switches $S_{21a}$, $S_{21b}$, $S_{22a}$, $S_{22b}$, $S_{23a}$, and $S_{23b}$ is the same as the above-described method. Due to the applied inputs, the three switches $S_{21a}$, $S_{22a}$, and $S_{23b}$ of the second resistor line RL2 are closed, and the three switches $S_{21b}$, $S_{22b}$, and $S_{23a}$ thereof are opened. Referring to FIG. 9, as the inputs $x_1$, $x_2$, and $x_3$ applied to the first resistor line RL1 and the second resistor line RL2 are the same, it may be seen that paths through which currents of the first resistor line RL1 and the second resistor line RL2 flow are the same.

When the inputs $x_1$, $x_2$, and $x_3$ are applied to the first resistor line RL1 and the second resistor line RL2, a current is applied to each of the first resistor line RL1 and the second resistor line RL2, and a total voltage is measured at the top of each of the resistor lines RL1 and RL2. Although currents $I_1$ and $I_2$ that are applied to the first resistor line RL1 and the second resistor line RL2 may be the same or different from each other, in an example described below, the same current, that is, 1 A, is applied.

The total voltage generated in the first resistor line RL1 due to the 1 A current is 45 V as described above, and the total voltage in the second resistor line RL2 is 15 V. Accordingly, referring to Table 3, the voltage meter 150 may output −3 that is the sum of multiplications of the inputs $x_1$, $x_2$, and $x_3$ and the weights $w_{12}$, $w_{22}$, and $w_{32}$ applied to the second resistor line RL2. The inputs, weights and voltages for the respective resistors due to the current source with respect to the second resistor line RL2 may be summarized in Table 8 below.

TABLE 8

| Second Resistor Line RL2 | Input | Weight | Input * Weight | Resistance (Ω) | Current (A) | Voltage (V) |
|---|---|---|---|---|---|---|
| First Resistor $R_{21}$ | 1 | −1 | −1 | 5 | 1 | 5 |
| Second Resistor $R_{22}$ | 1 | −1 | −1 | 5 | 1 | 5 |
| Third Resistor $R_{23}$ | −1 | 1 | −1 | 5 | 1 | 5 |
| Resistor Line | n/a | n/a | n/a | 15 | 1 | 15 |

Figure 10A:
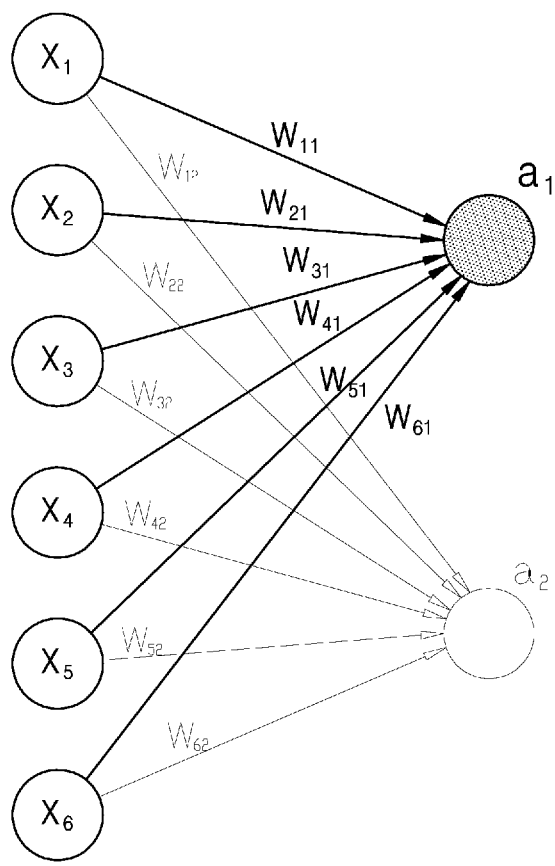
FIGS. 10A and 10B illustrates an example of the structure and operation of a neuromorphic device that performs an addition of multiplications of an input and a weight applied to two-row resistor lines.
Figure 10B:
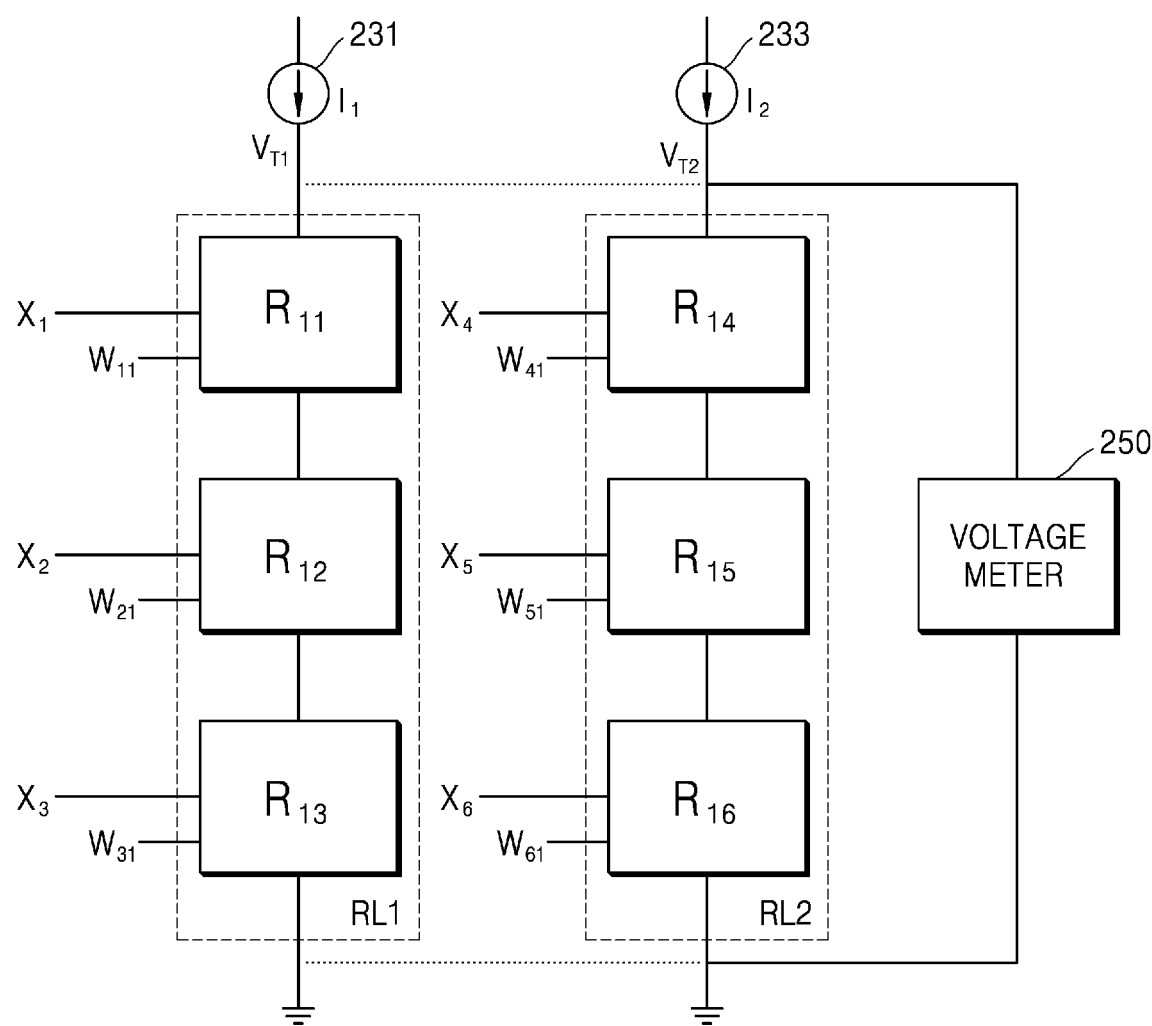

FIGS. 10A and 10B illustrate an example of the structure and operation of a neuromorphic device that performs an addition of multiplications of an input and a weight applied to two-row resistor lines.

In the following description, referring to FIGS. 10A and 10B, a neuromorphic device which may be used even when the number of applied inputs exceeds the number of resistors included in one resistor line, and a driving method thereof, are described.

Referring to FIG. 10A, a network in which a first layer 270 has six nodes and a second layer 290 has two nodes is illustrated as an example. In the first node $a_1$ of the second layer 290, as in Equation 5, six multiplication operations of multiplying inputs $x_1$, $x_2$, $x_3$, $x_4$, $x_5$, and $x_6$ from the first layer 270 by weights $w_{11}$, $w_{21}$, $w_{31}$, $w_{41}$, $w_{51}$, and $w_{61}$ thereof, and an addition operation of summing multiplication result values, may be performed.

$$a_1 = x_1 \cdot w_{11} + x_2 \cdot w_{21} + x_3 \cdot w_{31} + x_4 \cdot w_{41} + x_5 \cdot w_{51} + x_6 \cdot w_{61} \qquad \text{Equation 5:}$$

FIG. 10B illustrates an example of the structure of the neuromorphic device used for an operation performed in the first node $a_1$. Referring to FIG. 10B, the neuromorphic device may include the two-row resistor lines RL1 and RL2, to which the first to third resistors $R_{11}$, $R_{12}$, and $R_{13}$ and first to third resistors $R_{14}$, $R_{15}$, and $R_{16}$ are respectively serially connected, current sources 231 and 233 for applying a current to the respective resistor lines RL1 and RL2, and a voltage meter 250 for measuring a total voltage applied to each of the resistor lines RL1 and RL2. The difference between the examples described with reference to FIGS. 10B and 8B is that the inputs applied to the resistors arranged in the same row are independent of each other. For example, as the input $x_1$ applied to the first resistor $R_{11}$ of the first resistor line RL1 and an input $x_4$ applied to a first resistor $R_{14}$ of the second resistor line RL2 are independent of each other, different values may be applied thereto. In other words, when the input $x_1$ is 1, the input $x_4$ is −1. Thus, different values may be input to the resistors $R_{11}$ and $R_{14}$ that are disposed in the same row. For the independent application of inputs, input lines (not shown; for example, a gate line of a switch that is serially connected to a variable resistor) to apply inputs to the first to third resistors $R_1$, $R_{12}$, and $R_{13}$ included in the first resistor line RL1, and input lines to apply inputs to the first to third resistors $R_{14}$, $R_{15}$, and $R_{16}$ included in the second resistor line RL2, may be configured to be independently controlled. The application of inputs may be controlled by a separate controller (not shown). In this state, a controller for controlling application of inputs and a controller for controlling application of weights may be implemented by separate devices or one device.

Although the number of multiplication operations needed in the first node $a_1$ of the second layer 290 of FIG. 10A is 6, the number of resistors included in one resistor line is 3. Accordingly, when multiple multiplication operations are not processed in one resistor line, the structure of FIG. 10B may be used.

In the description of the example of FIGS. 10A and 10B, an example is described, in which the number of requested multiplication operations is the same as the number of resistors included in two resistor lines, and it is assumed for the description that values needed for operations performed in the first node $a_1$ are the same as those shown in Table 9.

TABLE 9

| Input | | Weight | | Input * Weight |
|---|---|---|---|---|
| $x_1$ | 1 | $w_{11}$ | 1 | 1 |
| $x_2$ | 1 | $w_{21}$ | −1 | −1 |
| $x_3$ | −1 | $w_{31}$ | −1 | 1 |
| $x_4$ | 1 | $w_{41}$ | −1 | −1 |
| $x_5$ | −1 | $w_{51}$ | 1 | −1 |
| $x_6$ | −1 | $w_{61}$ | 1 | −1 |
| Sum of Input * Weight | | | | −2 |

The operation of Equation 5 performed in the first node $a_1$ may be divided into an operation performed in the first resistor line RL1, as in Equation 6, and an operation performed in the second resistor line RL2, as in Equation 7. A final result value may be obtained by summing the respective operation results.

First Resistor Line RL1: $x_1 \cdot w_{11} + x_2 \cdot w_{21} + x_3 \cdot w_{31}$     Equation 6

Second Resistor Line RL2: $x_4 \cdot w_{41} + x_5 \cdot w_{51} + x_6 \cdot w_{61}$     Equation 7

To perform the operations, the weight of each resistor is set, and an input is applied to each resistor and then a current is applied to each resistor line. The current $I_1$ supplied to the first resistor line RL1 and the current $I_2$ supplied to the second resistor line RL2 may be the same value or different from each other. As an example, it is assumed that the current $I_1$ of the first resistor line RL1 is 1 A, and the current $I_2$ of the second resistor line RL2 is 2 A. In FIG. 10B, an example of the separate current sources 231 and 233 respectively applying currents to the first resistor line RL1 and the second resistor line RL2 is not illustrated, but the configuration is not limited thereto and one current source may apply a current to each resistor line with a time difference.

Figure 11:
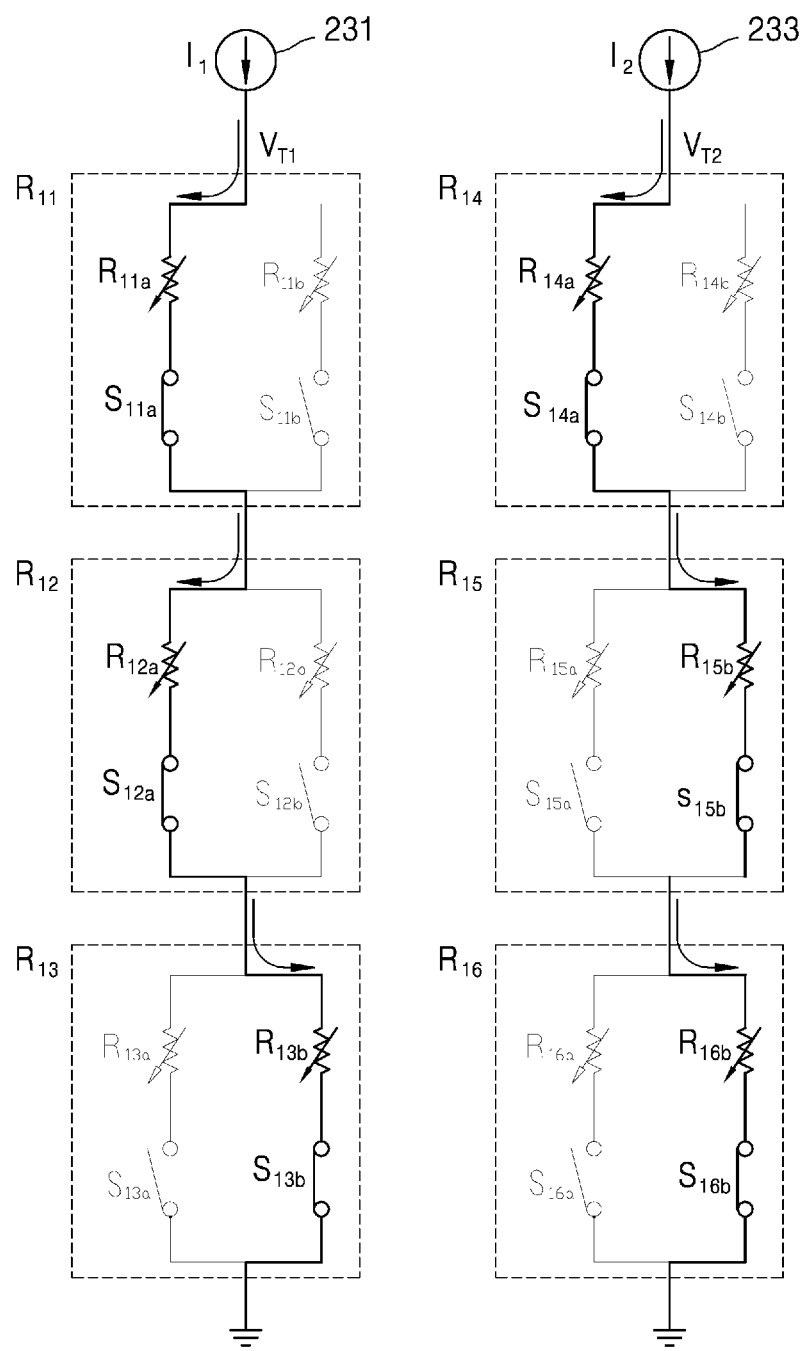
FIG. 11 illustrates an operation when a current is applied to the neuromorphic device of FIG. 8B.

FIG. 11 illustrates an operation when a current is applied to the neuromorphic device of FIG. 8B.

Referring to FIG. 11, as the input values applied to the resistors included in each of the first resistor line RL1 and the second resistor line RL2 are different from each other, it may be seen that paths of currents flowing in the respective resistor lines are different from each other.

In summary of the values operated through the first resistor line RL1 and the second resistor line RL2, as Equation 6 is set to be identical to Equation 2, a result of the first resistor line RL1 is the same as that in Table 4. A result of the second resistor line RL2 summarized in a similar manner is shown in Table 10 below.

TABLE 10

| Second Resistor Line RL2 | Input | Weight | Input * Weight | Resistance (Ω) | Current (A) | Voltage (V) |
|---|---|---|---|---|---|---|
| First Resistor $R_{14}$ | 1 | −1 | −1 | 5 | 2 | 10 |
| Second Resistor $R_{15}$ | −1 | 1 | −1 | 5 | 2 | 10 |
| Third Resistor $R_{16}$ | −1 | 1 | −1 | 5 | 2 | 10 |
| Resistor Line | n/a | n/a | n/a | 15 | 2 | 30 |

As such, the total voltage measured at the upper terminal of the second resistor line RL2 corresponds to 30 V, and the value corresponds to a fourth section with reference to Table 11 indicating results of the respective sections with respect to a 2 A current. Accordingly, it may be seen that an operation result of Equation 7 is −3.

TABLE 11

| Section | Range of Voltage for Each Section | Sum of Input * Weight |
|---|---|---|
| First Section | $V_T \geq 105$ V | 3 |
| Second Section | 105 V > $V_T \geq 75$ V | 1 |
| Third Section | 75 V > $V_T \geq 45$ V | −1 |
| Fourth Section | 45 V > $V_T$ | −3 |

Accordingly, it may be seen that values corresponding to the calculation results of Equation 6 and Equation 7 are obtained, and the result value of Equation 5 that is a result of the operation performed in the first node $a_1$ of the second layer 290 is −2 that is a value obtained by summing the result value of Equation 6 and the result value of Equation 7. Although the calculation of summing the result values of Equation 6 and Equation 7 may be performed in a digital circuit domain, the configuration is not limited thereto.

In the examples described in FIGS. 8A to 11, for convenience of explanation, an example is described, in which the number of resistors included in one resistor line is three and the number of resistor lines is two. However, the configuration is not limited thereto, and the number of resistors included in one resistor line and the number of resistor lines used for operation may be changed. For example, when the number of multiplication operations needed for a certain node is greater than the number of resistors included in one resistor line, as in the examples described with reference to FIGS. 10A to 11, the multiplication operation may be performed by using two or more resistor lines.

As the number of resistors included in the neuromorphic device is limited while the amount of inputs to be processed in the neuromorphic device increases, a situation may frequently occur, in which the structure as in the example described with reference to FIGS. 10A to 11 is used. In particular, when the total voltage is measured after a current is applied to the resistor line where resistors are serially connected, as the number of rows receiving inputs increases, that is, as the number of serially connected resistors increases, the maximum voltage to be applicable to the resistor line increases. However, as the maximum voltage to be applicable to the resistor line may not exceed the power voltage of the current source, the number of serially connected resistors may be limited. Furthermore, as the number of serially connected resistors increases, noise increases as well, and thus a reliability problem may be generated. Accordingly, when inputs greater than the number of serially connected resistors are applied, the operations may not be simultaneously processed by using one resistor line, and thus the inputs may be divided and applied to a plurality of resistor lines, or the inputs may be divided and applied to one resistor line with a time difference to be partially calculated and then calculation results may be summed.

Figure 12A:
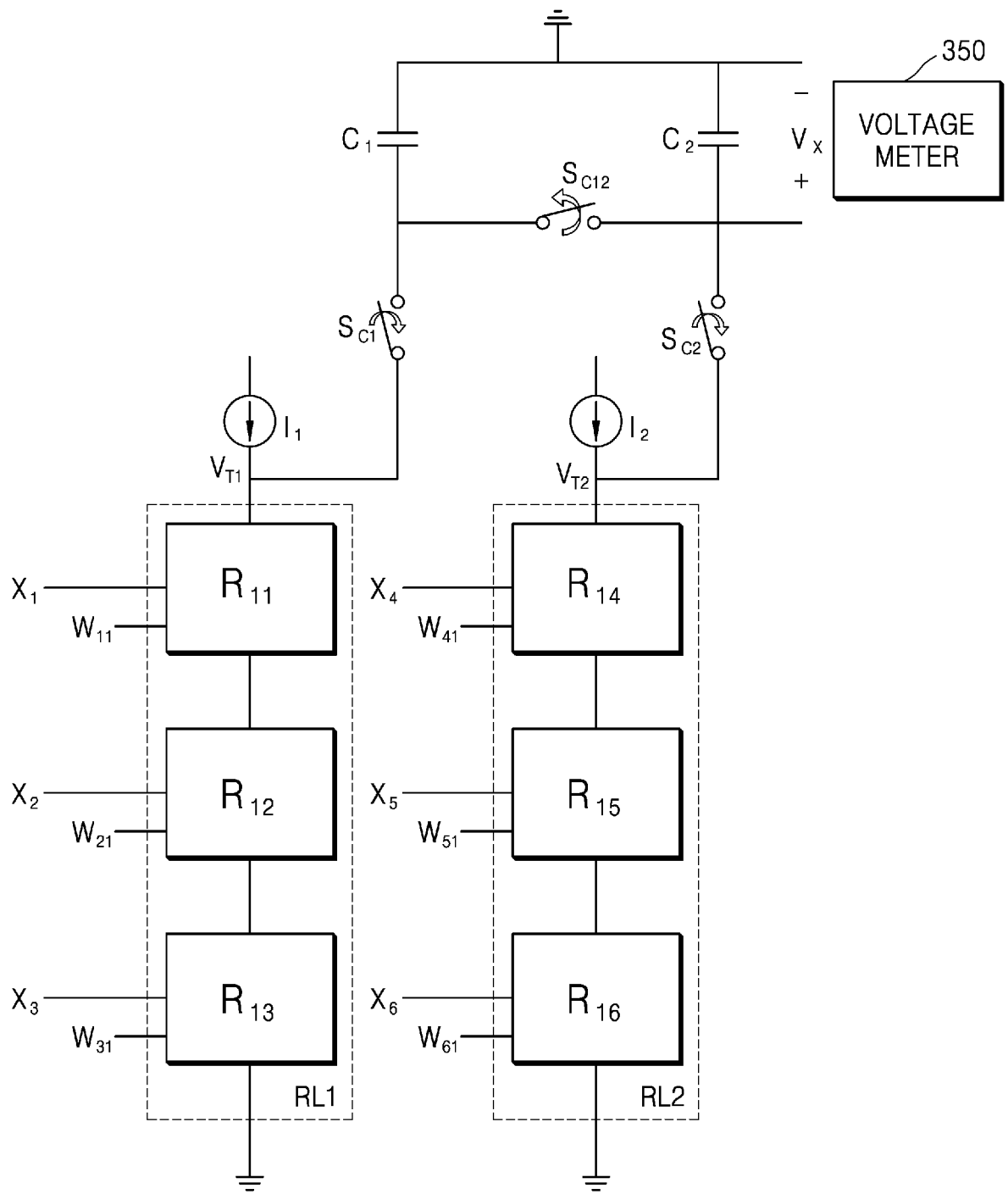
FIGS. 12A and 12B illustrate an example of the structure and operation of a neuromorphic device that operates in an analog domain an addition of multiplications of an input and a weight applied to two-row resistor lines.
Figure 12B:
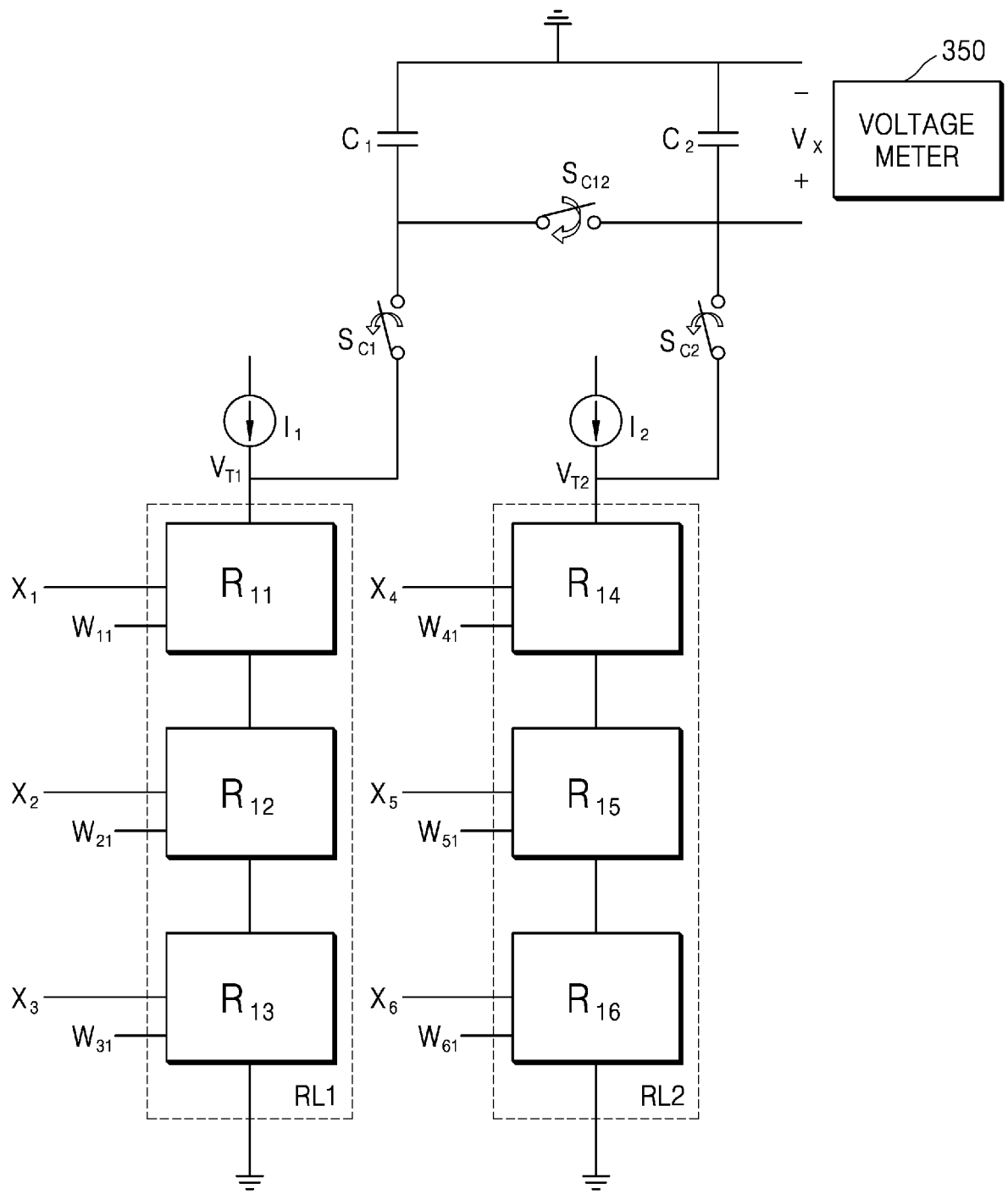

FIGS. 12A and 12B illustrate an example of the structure and operation of a neuromorphic device that operates in an analog domain an addition of multiplications of an input and a weight applied to two-row resistor lines.

In the following description, referring to FIGS. 12A and 12B, the summing of the result values of Equation 6 and Equation 7 in the above-described example preformed in an analog circuit domain is described.

The neuromorphic device illustrated in FIG. 12A, compared to the neuromorphic device illustrated in FIG. 10B, may further include a first capacitor $C_1$ that is electrically connected to the first resistor line RL1 and a second capacitor $C_2$ that is electrically connected to second resistor line RL2, and may include a voltage meter 350 configured to measure a voltage between both terminals of each of the first and second capacitors $C_1$ and $C_2$. The first capacitor $C_1$ and the second capacitor $C_2$ may have the same capacitance. The capacitance may have, for example, a value of 0.1 fF to 100 fF.

In the example of FIGS. 12A and 12B, it is assumed that the input and the weight are the same as those in Table 9, and the first current I1 and the second current I2 are the same as 1 A. As described above, separate current sources may be arranged to supply a current flowing in each resistor line, but the configuration is not limited thereto and one current source may sequentially apply a current to each resistor line. The input, the weight, and the voltage with respect to the first resistor line RL1 are the same as those in Table 4, and the input, the weight, and the voltage with respect to the second resistor line RL2 are the same as those in Table 12.

TABLE 12

| Second Resistor Line RL2 | Input | Weight | Input * Weight | Resistance (Ω) | Current (A) | Voltage (V) |
|---|---|---|---|---|---|---|
| First Resistor $R_{14}$ | 1 | −1 | −1 | 5 | 1 | 5 |
| Second Resistor $R_{15}$ | −1 | 1 | −1 | 5 | 1 | 5 |
| Third Resistor $R_{16}$ | −1 | 1 | −1 | 5 | 1 | 5 |

TABLE 12-continued

| Second Resistor Line RL2 | Input | Weight | Input * Weight | Resistance (Ω) | Current (A) | Voltage (V) |
|---|---|---|---|---|---|---|
| Resistor Line | n/a | n/a | n/a | 15 | 1 | 15 |

In the following description, a method of performing a sum of multiplications of inputs and weights applied to resistors included in different resistor lines in an analog circuit domain, through the example of FIGS. 12A and 12B, is described.

First, weights and inputs are applied to each resistor, and a current of the same amount is applied to each resistor line. In this state, a voltage generated at the top of each resistor line is sampled by different capacitors.

The total voltage $V_{T1}$ of the first resistor line RL1 is sampled by the first capacitor $C_1$, and a total Voltage $V_{T2}$ of the second resistor line RL2 is sampled by the second capacitor $C_2$. One terminal of the first capacitor $C_1$ is electrically connected to an upper terminal of the first resistor line RL1, and thus a voltage at one terminal of the first capacitor $C_1$ that is the same as the total voltage $V_{T1}$ of the first resistor line RL1 may be sampled. Likewise, one terminal of the second capacitor $C_2$ is electrically connected to an upper terminal of the second resistor line RL2, and thus a voltage at one terminal of the second capacitor $C_2$ that is the same as the total Voltage $V_{T2}$ of the second resistor line RL2 may be sampled.

As illustrated in FIG. 12A, during sampling, as the first capacitor $C_1$ is electrically connected to the upper terminal of the first resistor line RL1, a first capacitor switch $S_{C1}$ disposed between the first capacitor $C_1$ and the first resistor line RL1 is closed, and as the second capacitor $C_2$ is electrically connected to the upper terminal of the second resistor line RL2, and a second capacitor switch $S_{C2}$ disposed between the second capacitor $C_2$ and the second resistor line RL2 is also closed. A switch $S_{C12}$ between capacitors, which electrically connects the first capacitor $C_1$ and the second capacitor $C_2$, is opened. As such, a state in which the first capacitor $C_1$ and the second capacitor $C_2$ are respectively electrically connected to the first resistor line RL1 and the second resistor line RL2 to sample a voltage may be referred to as a first state. The upper terminal of each of the first capacitor $C_1$ and the second capacitor $C_2$ is grounded. Accordingly, in the first state, due to the total voltage $V_{T1}$ of the first resistor line RL1, the voltage at both terminals of the first capacitor $C_1$ is the same as the total voltage $V_{T1}$ of the first resistor line RL1, and due to the total Voltage $V_{T2}$ of the second resistor line RL2, the voltage at both terminals of the second capacitor $C_2$ is the same as the total Voltage $V_{T2}$ of the second resistor line RL2. Accordingly, from Q=CV, an amount of charge $Q_{11}$ charged in the first capacitor $C_1$ is $C*V_{T1}$, and similarly, an amount of charge $Q_{12}$ charged in the second capacitor $C_2$ is $C*V_{T2}$.

After sampling, as illustrated in FIG. 12B, the first capacitor switch $S_{C1}$ and the second capacitor switch $S_{C2}$ are opened and the switch $S_{C12}$ is closed. A state in which the first and second capacitors $C_1$ and $C_2$ are connected in parallel, that is, a state in which the voltages at one terminals of the first and second capacitors $C_1$ and $C_2$ are maintained constant (grounded) and the other terminals of the first and second capacitors $C_1$ and $C_2$ are electrically connected to each other and floated may be referred to as a second state. In the second state, as charges charged in the first and second capacitors $C_1$ and $C_2$ do not move to the outside, an amount of charge is maintained, and a specific voltage is formed at a floating terminal as charges move between the first and second capacitors $C_1$ and $C_2$. The voltage is referred to as a summed voltage $V_X$. In the second state, an amount of charge $Q_{21}$ charged in the first capacitor $C_1$ is $C^*V_X$, and an amount of charge $Q_{22}$ charged in the second capacitor $C_2$ is $C^*V_X$.

The, the voltage meter 350 measures the voltage at both terminals of each of the first capacitor $C_1$ and the second capacitor $C_2$.

According to the law of conservation of charge, as in Equation 8, the sum of the total voltage $V_{T1}$ of the first resistor line RL1 and the total Voltage $V_{T2}$ of the second resistor line RL2 may be seen from the measured voltage of both terminals of each of the first capacitor $C_1$ and the second capacitor $C_2$. As a current is 1 A, the operation result of Equation 5 may be obtained from the values.

First State: $Q_{11} = C^*V_{T1}$, $Q_{12} = C^*V_{T2}$

Second State: $Q_{21} = C^*V_X$, $Q_{22} = C^*V_X$

Conservation of Charge: $Q_{11} + Q_{12} = Q_{21} + Q_{22}$ $$V_{T1} + V_{T2} = 2^*V_X \quad \text{Equation 8}$$

A relationship between the summed voltage $V_X$ and the output value of an operation result of Equation 5 may be summarized in Table 13 below.

TABLE 13

| Section | Measurement Voltage | Output Value |
|---|---|---|
| First Section | Vx ≥ 56.25 | 6 |
| Second Section | 56.25 > Vx ≥ 48.75 | 4 |
| Third Section | 48.75 > Vx ≥ 41.25 | 2 |
| Fourth Section | 41.25 > Vx ≥ 33.75 | 0 |
| Fifth Section | 33.75 > Vx ≥ 26.25 | −2 |
| Sixth Section | 26.25 > Vx ≥ 18.75 | −4 |
| Seventh Section | 18.75 > Vx | −6 |

When the summed voltage $V_X$ is 30 V, the voltage meter 350 may output −2, which is the sum of multiplications of inputs and weights applied to the resistors included in each of the first resistor line RL1 and the second resistor line RL2.

FIGS. 12A and 12B illustrate that, as the number of inputs exceeds the number of resistors included in the resistor line, even when a plurality of resistor lines is used, an operation may be performed by using a capacitor in an analog domain. In FIG. 12A, for convenience of explanation, an example of a structure is described, in which the sum of multiplications of inputs and weights applied to two-row resistor lines is operated in an analog domain. However, the configuration is not limited thereto, and the structure may be similarly employed even when the neuromorphic device is provided with a variety of numbers of resistor lines such as three or more row of resistor lines, for example five rows, ten rows, etc. A capacitor that is electrically connected to each resistor line may sample the voltage of each resistor line, and the sampled voltages may be measured by being connected in parallel and then summed.

Although FIG. 12A illustrates a structure in which the sum of multiplications of inputs and weights applied to the entire resistor line is operated, the configuration is not limited thereto, and only some resistor lines of a plurality of resistor lines, which need to be summed, are connected to the capacitor and selectively operated. Furthermore, although FIG. 12A illustrates a structure in which only one capacitor is connected to the resistor line, a plurality of capacitors, for example, four capacitors, may be connected to one resistor line considering various factors such as capacitance, device arrangement, etc.

In FIGS. 12A and 12B, an example of a structure is described, in which the upper ports of the first and second capacitors $C_1$ and $C_2$ are grounded, and in the second state, the lower ports of the first and second capacitors $C_1$ and $C_2$ are floated. However, the voltage in the second state may be measured by being connected in parallel in various other methods, which is described with reference to FIGS. 13A and 13B.

Figure 13A:
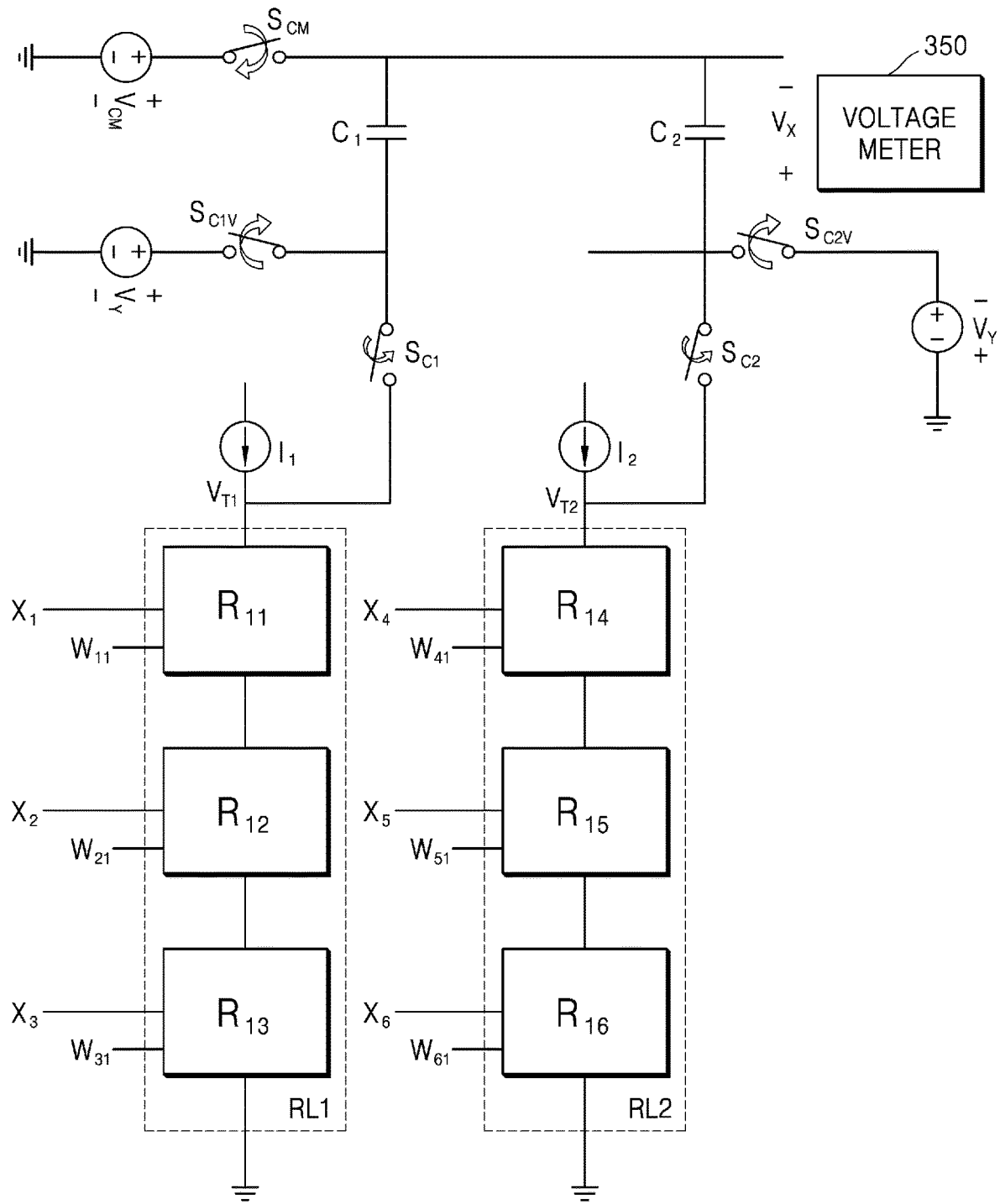
FIGS. 13A and 13B illustrate an example of the structure and operation of a neuromorphic device that operates in an analog domain an addition of multiplications of an input and a weight applied to two-row resistor lines.
Figure 13B:
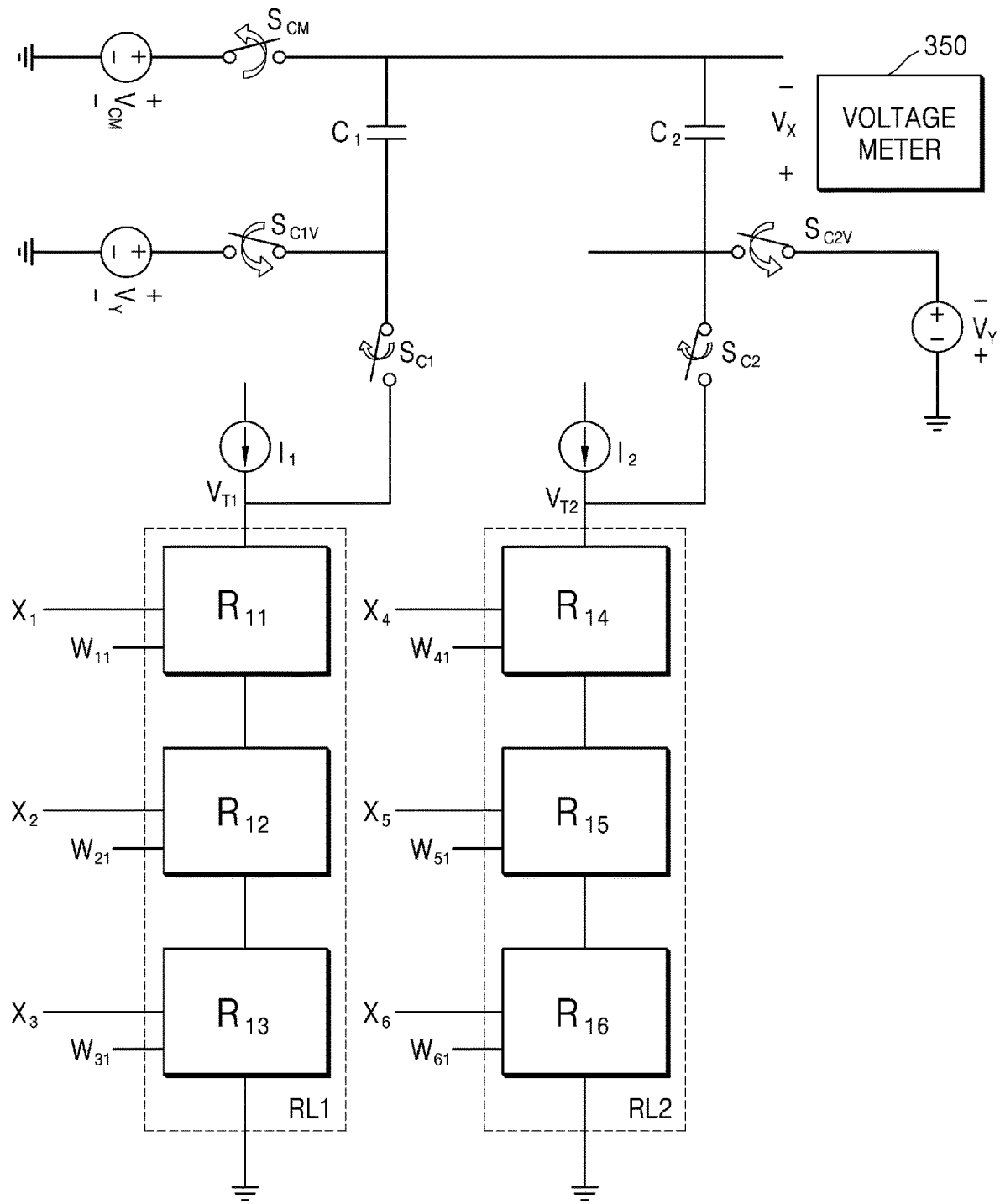

FIGS. 13A and 13B illustrate an example of the structure and operation of a neuromorphic device that operates in an analog domain an addition of multiplications of an input and a weight applied to two-row resistor lines.

Referring to FIG. 13A, in the first state, by closing a common voltage switch $S_{CM}$ and the first and second capacitor switches $S_{C1}$ and $S_{C2}$, the upper ports of the first and second capacitors $C_1$ and $C_2$ are fixed to a common voltage $V_{CM}$, and accordingly first and second voltages $V_{T1}$ and $V_{T2}$ are sampled in the first and second capacitors $C_1$ and $C_2$.

Referring to FIG. 13B, in the second state, by opening the common voltage switch $S_{CM}$, the upper ports of the first and second capacitors $C_1$ and $C_2$ are floated, and by opening the first and second capacitor switches $S_{C1}$ and $S_{C2}$ and closing switches $S_{C1V}$ and $S_{C2V}$, the lower ports of the first and second capacitors C1 and C2 are fixed to a second voltage $V_Y$. In the second state, by measuring a voltage different of the upper ports and the lower ports of the first and second capacitors $C_1$ and $C_2$, the sum of multiplications of inputs and weights applied to the two resistor lines RL1 and RL2 may be obtained in an analog circuit domain.

As involvement of a digital operation increases the use frequency of ADC, a quantization error generated by the ADC may increase, and also power efficiency may deteriorate. Accordingly, as described above, as the neuromorphic device capable of operating the sum of multiplications of inputs and weights applied to a plurality of resistor lines in an analog circuit domain is used, an efficient operation may be performed.

Figure 14:
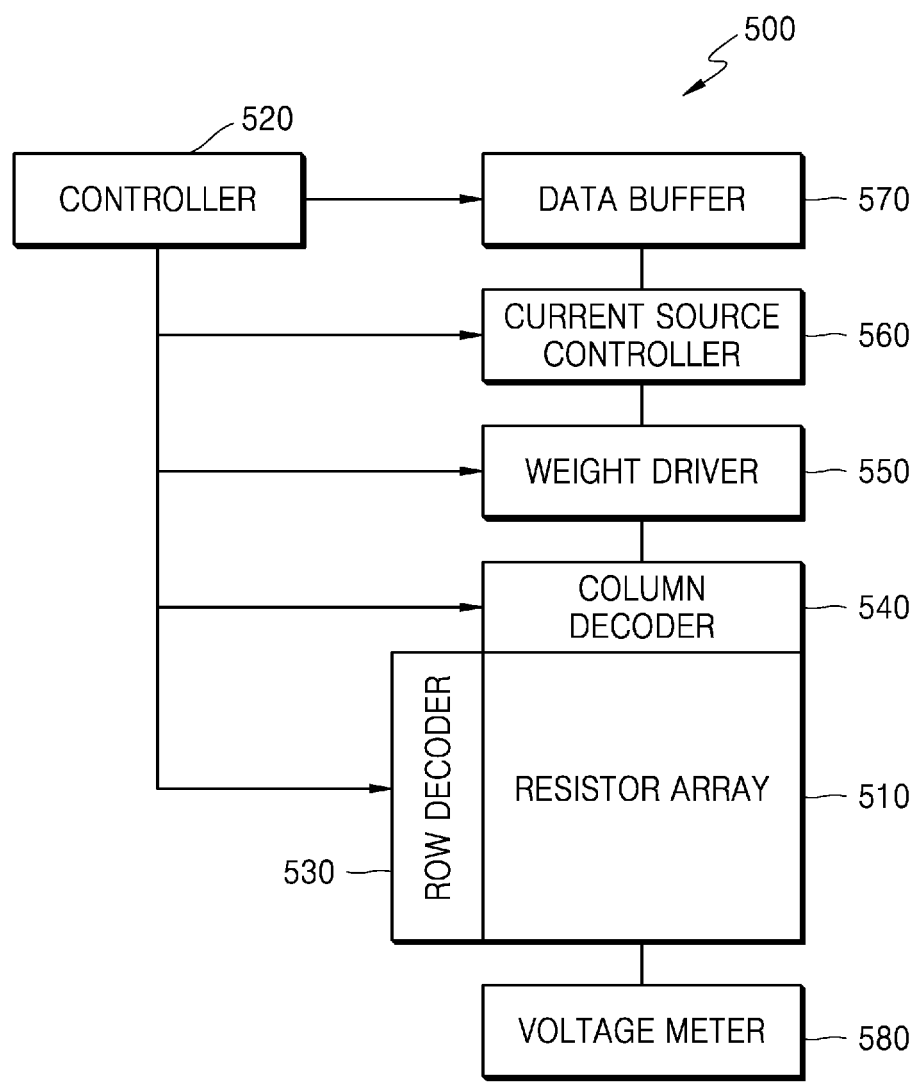
FIG. 14 is a chip block diagram of a neuromorphic device according to an example.

FIG. 14 is a chip block diagram of a neuromorphic device 500 according to an example.

Referring to FIG. 14, a hardware configuration of the neuromorphic device 500 according to an example is illustrated. The neuromorphic device 500 may include a resistor array 510, a controller 520, a row decoder 530, a column decoder 540, a weight driver 550, a current source controller 560, a voltage meter 580, and a data buffer 570. The neuromorphic device 500 illustrated in FIG. 14 includes constituent elements related to the present example. However, the configuration is not limited thereto, and the neuromorphic device 500 may further include general purpose constituent elements other than the constituent elements illustrated in FIG. 14.

The controller 520 may decode instructions needed for driving and operation of the neuromorphic device 500. For example, the controller 520 decodes instructions such as weight setting, weight setting test, input application, voltage measurement, etc., and transmits signals to elements needed for executing these instructions.

The resistor array 510 may be an array of resistors including, for example, the above-described variable resistors and switches. In this state, the variable resistor may be the MTJ device having a magnetic material.

The row decoder 530 may receive a row address and an input signal and apply an input value to the resistor array

510. The row decoder 530 may include a digital-to-analog converter (DAC), and may apply a driving voltage to the switch serially connected to the variable resistor, on the basis of the input value. Furthermore, the row decoder 530 may change the resistance value of variable resistor included in the resistor of the resistor array 510. In this state, the row decoder 530, during weight setting, may apply a driving voltage to a related switch to select a target variable resistor.

The column decoder 540 may receive a column address and a weight setting signal and apply a voltage/current to the variable resistor. The column decoder 540 may select a resistor line which needs voltage measurement, and a weight line connected to the resistor needing weight setting.

The weight driver 550, during weight setting, may transmit weight data to a resistor selected by the row decoder 530 and the column decoder 540. The weight driver 550 may drive the weight line connected to the column decoder 540 on the basis of the data received from the data buffer 570, and perform setting of a weight and a test of the set weight. The weight driver 550 may include a current source for applying a test current to the weight line to test whether a desired resistance value is set to the variable resistor.

The current source controller 560 may receive signals from the controller 520 to drive the current source, and apply a current to the resistor line.

The voltage meter 580 may measure the voltage of the resistor line or a capacitor connected to one terminal of the resistor line, and store a measurement value in an external memory (not shown). The voltage meter 580 may include an ADC that outputs a measurement value as a digital value.

Figure 15:
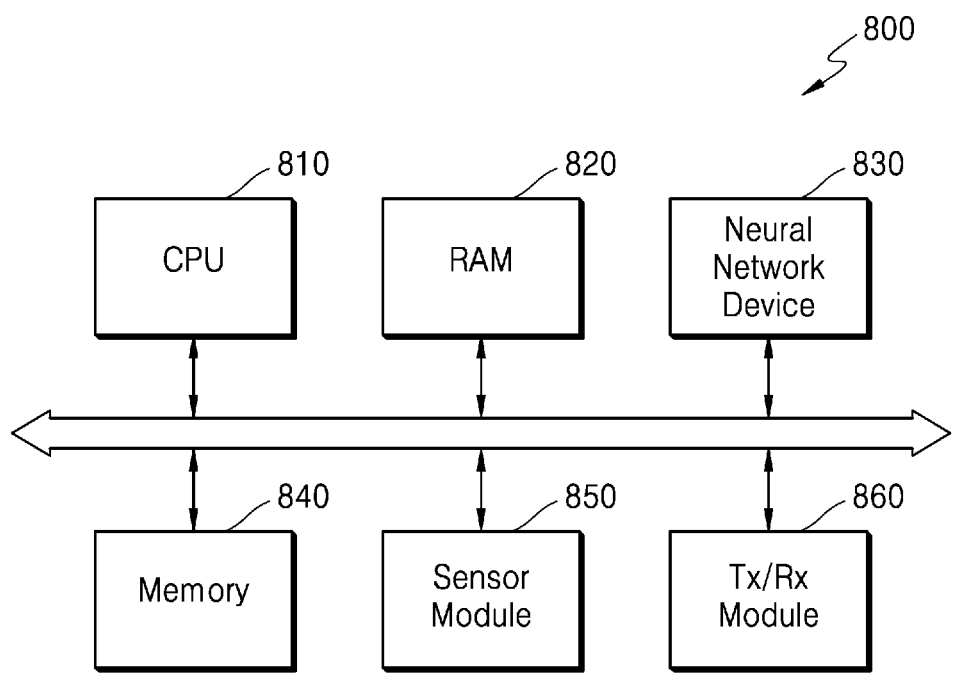
FIG. 15 is a block diagram of an electronic system according to an example.

FIG. 15 is a block diagram of an electronic system 800 according to an example.

Referring to FIG. 15, the electronic system 800 may extract valid information by analyzing input data on the basis of a neural network device 830 including the neuromorphic device, determine a situation on the basis of extracted information, or control elements of an electronic device equipped with the electronic system 800. For example, the electronic system 800 may be applied to robot devices such as drones, advanced drivers assistance systems (ADAS), smart TVs, smartphones, medical devices, mobile devices, image display devices, measurement devices, IoT devices, etc., and mounted on various other kinds of electronic devices.

The electronic system 800, in addition to the neural network device 830, may include a CPU 810, a RAM 820, a memory 840, a sensor module 850, and a communication module (Tx/Rx Module) 860. Additionally, the electronic system 800 may further include an input/output module, a security module, a power control device, etc. Some of hardware configurations of the electronic system 800 may be mounted on a semiconductor chip. The neural network device 830 may be a device implemented as an on-chip type of the neuromorphic device described above in the drawings, or a device including the neuromorphic device described above in the drawings as a part.

The CPU 810 may control an overall operation of the electronic system 800. The CPU 810 may include one processor core (single core), or a plurality of processor cores (multi-core).

The CPU 810 may process or execute programs and/or data stored in the memory 840. The CPU 810 may control the function of the neural network device 830 by executing the programs stored in the memory 840. The function of the CPU 810 may be implemented by a graphic processing unit (GPU), application processor (AP), etc.

The RAM 820 may temporarily store programs, data, or instructions. For example, the programs and/or data stored in the memory 840 may be temporarily stored in the RAM 820 according to a control or booting code of the CPU 810. The RAM 820 may be implemented by a memory device such as dynamic RAM (DRAM), static RAM (SRAM), etc.

The neural network device 830 may perform an operation of a neural network on the basis of received input data, and generate an information signal on the basis of an operation result. The neural network device 830 may include the neuromorphic device described above in the drawings. The neural network may include a convolution neural network (CNN), a recurrent neural network (RNN), a deep belief network, a restricted Boltzmann machine, etc., but the configuration is not limited thereto. The neural network device 830 may correspond to a neural network dedicated hardware accelerator.

An information signal may include various types of recognition signals such as a voice recognition signal, an object recognition signal, an image recognition signal, a biometric information recognition signal, etc. For example, the neural network device 830 may receive frame data included in a video stream as input data, and generate a recognition signal regarding an object included in an image represented by frame data. The neural network device 830 may receive various types of input data and generate a recognition signal according to the input data, depending on the type or function of the electronic device equipped with the electronic system 800.

The memory 840, which is a storage place for storing data, may store an operating system (OS), various programs, and various data. The memory 840 may include a volatile memory or a non-volatile memory. The non-volatile memory may include read only memory (ROM), programmable ROM (PROM), electrically programmable ROM (EPROM), electrically erasable and programmable ROM (EEPROM), a flash memory, phase-change RAM (PRAM), magnetic RAM (MRAM), resistive RAM (RRAM), ferroelectric RAM (FRAM), etc. The volatile memory may include dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM), etc. The memory 840 may include, for example, a hard disk drive (HDD), a solid state drive (SSD), a compact flash (CF) card, a secure digital (SD) card, a micro secure digital (Micro-SD) card, a mini secure digital (Mini-SD) card, an extreme digital (xD) card, Memory Stick, etc.

The sensor module 850 may collect information around the electronic device equipped with the electronic system 800. The sensor module 850 may sense or receive a signal, for example, a video signal, a voice signal, a magnetic signal, a bio signal, a touch signal, etc., from the outside of the electronic device, and convert the sensed or received signal into data. To this end, the sensor module 850 may be various types of sensing devices, for example, a microphone, an imaging device, an image sensor, a light detection and ranging (LIDAR) sensor, an ultrasonic sensor, an infrared sensor, a biosensor, a touch sensor, etc.

The sensor module 850 may provide the converted data to the neural network device 830 as input data. For example, the sensor module 850 may include an image sensor, generate a video stream by photographing the external environment of the electronic device, and provide successive data frames of the video stream, in order, as input data to the neural network device 830. However, the configuration is not limited thereto, and the sensor module 850 may provide various types of data to the neural network device 830.

The communication module 860 may be equipped with various wired or wireless interfaces for communication with an external device. For example, the communication module 860 may include a communication interface that is connectable to a wired local area network (LAN), a wireless local area network (WLAN) such as a wireless fidelity (Wi-Fi), a wireless personal area network (WPAN) such as Bluetooth, wireless universal serial bus (USB), Zigbee, Near Field Communication (NFC), radio-frequency identification (RFID), power line communication (PLC), or a mobile cellular network such as 3rd generation (3G), 4th generation (4G), long term evolution (LTE), 5th generation (5G), etc.

The electronic system 800 may include a processor, a memory for storing program data and executing it, a permanent storage unit such as a disk drive, a communications terminal for handling communications with external devices, and user interface devices, including a touch panel, keys, buttons, etc. When software modules or algorithms are involved, these software modules may be stored as program instructions or computer-readable codes executable on a processor on a computer-readable recording medium.

The particular implementations shown and described herein are illustrative examples of the disclosure and are not intended to otherwise limit the scope of the disclosure in any way. For the sake of brevity, conventional electronics, control systems, software development and other functional aspects of the systems may not be described in detail. Furthermore, the connecting lines, or connectors shown in the various figures presented are intended to represent functional relationships and/or physical or logical couplings between the various elements.

According to examples, reliability of a neuromorphic device may be improved.

According to examples, by expanding a range of an operation in an analog circuit domain by using a capacitor, power efficiency of the neural network device including the neuromorphic device, and the electronic system, may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A neuromorphic device comprising:
    a first resistor line comprising a plurality of first resistors that are serially connected to each other;
    a second resistor line comprising a plurality of second resistors that are serially connected to each other;
    one or more current sources configured to control a current flowing in each of the first resistor line and the second resistor line to a respective current value;
    a first capacitor configured to be electrically connected to the first resistor line; and
    a second capacitor configured to be electrically connected to the second resistor line,
    wherein respective voltages of the first and second capacitors represent results of first and second neuromorphic operations.

2. The neuromorphic device of claim 1, further comprising a switch configured to connect the first capacitor to the second capacitor in parallel.

3. The neuromorphic device of claim 2, further comprising a voltage meter configured to measure a voltage difference between both terminals of each of the first capacitor and the second capacitor in a configuration which the first and second capacitors are connected in parallel.

4. The neuromorphic device of claim 1, wherein the one or more current sources comprise a plurality of current sources including at least one first current source connected to the first resistor line and at least one second current source connected to the second resistor line.

5. The neuromorphic device of claim 1, wherein the one or more current sources comprise two current sources that are respectively connected to the first resistor line and the second resistor line.

6. The neuromorphic device of claim 1, further comprising a controller configured to apply inputs and weights to the plurality of first resistors and the plurality of second resistors.

7. The neuromorphic device of claim 1, wherein the one or more current sources are configured to control a first current flowing in the first resistor line and a second current flowing in the second resistor line to a same current value.

8. The neuromorphic device of claim 1, further comprising a controller configured to apply inputs and weights to the plurality of first resistors and the plurality of second resistors,
    wherein the controller is configured to independently control inputs to be applied to the plurality of first resistors and inputs to be applied to the plurality of second resistors.

9. The neuromorphic device of claim 1, wherein the first capacitor and the second capacitor have a same capacitance.

10. The neuromorphic device of claim 1, further comprising:
    a first switch disposed between the first capacitor and the first resistor line; and
    a second switch disposed between the second capacitor and the second resistor line.

11. The neuromorphic device of claim 1, wherein each of the first resistors and the second resistors comprises a magnetic memory device having a plurality of resistance values.

12. The neuromorphic device of claim 1, wherein a first terminal of the first capacitor and a first terminal of the second capacitor are electrically connected to each other.

13. The neuromorphic device of claim 1,
    wherein the one or more current sources include a first current source configured to apply a current to both of the first and second resistor lines, or second current sources configured to respectively apply currents to the first and second resistor lines,
    wherein each of the plurality of r resistors comprises at least two variable resistors that are connected in parallel to each other and switches that are respectively serially connected to the variable resistors.

14. The neuromorphic device of claim 13, wherein each of the plurality of first and second variable resistors comprises one variable resistor that has a first resistance value and another resistor that has a second resistance value.

15. The neuromorphic device of claim 13, further comprising a first weight line and a second weight line that are configured to be respectively electrically connected to respective terminals of each of the variable resistors dependent on respective operations of the switches, operations of first switches connected to the first weight line, and operations of second switches connected to the second weight line.

16. The neuromorphic device of claim 13, further comprising a voltage meter configured to measure a voltage based on respective voltages of the first and/or resistor lines.

17. The neuromorphic device of claim 16, further comprising a controller configured to control application of respective first inputs and respective first weights to the plurality of first resistors, and control application of respective second inputs and respective second weights to the plurality of second resistors,
wherein a sum of first respective products of the respective first inputs and the respective first weights and second respective products of the respective second inputs and the respective second weights is calculated based on the voltage measured by the voltage meter.

18. The neuromorphic device of claim 1,
wherein a voltage of the first capacitor represents a result of a multiply-and-accumulate (MAC) operation involving respective inputs, to or within a network, and corresponding first resistors, of the plurality of first resistors, that have resistances respectively representing parameters of the network, and
wherein a voltage of the second capacitor represents a result of another multiply-and-accumulate (MAC) operation involving respective other inputs, to or within the network, and corresponding second resistors, of the plurality of second resistors, that have resistances respectively representing other parameters of the network.

19. A method of driving a neuromorphic device, the method comprising:
applying a current having a current value to each of a first resistor line comprising a plurality of first resistors that are serially connected to each other and a second resistor line comprising a plurality of second resistors that are serially connected to each other;
sampling a first voltage of the first resistor line by using a first capacitor connected to the first resistor line, and a second voltage of the second resistor line by using a second capacitor connected to the second resistor line; and
measuring a voltage between both terminals of each of the first capacitor and the second capacitor in a case in which the first capacitor and the second capacitor are connected in parallel by switching a first terminal of the first capacitor and a first terminal of the second capacitor to be connected in parallel to each other.

20. The method of claim 19, further comprising calculating a sum of multiplications of inputs and weights applied to the plurality of first resistors and the plurality of second resistors from the measured voltage.

21. The method of claim 19, further comprising applying a resistance value to a variable resistor included in each of the first resistors and the second resistors.

22. The method of claim 19, wherein the sampling of the first voltage and the second voltage comprises sampling of the second voltage after sampling of the first voltage.

23. The method of claim 19, the method further comprising:
applying respective first inputs and respective first weights to the plurality of first resistors and applying respective second inputs and respective second weights to the plurality of second resistors; and
obtaining a sum of first respective products of the respective first inputs and the respective first weights and second respective products of the respective second inputs and the respective second weights based on respective voltages of the first and second resistor lines,
wherein the applying of the current is performed for the obtaining of the sum, and includes applying a first current to both of the first and second resistor lines, or respectively applying second currents to the first and second resistor lines, and
wherein each of the plurality of first and second resistors comprises at least two variable resistors that are connected in parallel to each other and switches that are respectively serially connected to the variable resistors.

24. The method of claim 23,
wherein each of the plurality of first and second resistors comprises at least two variable resistors, and
wherein the applying of the respective first weights to the plurality of first resistors results in the plurality of first resistors being set to have different resistance values, and the applying of the respective second weights to the plurality of second resistors results in the plurality of second resistors being set to have different resistance values.

25. The method of claim 23, wherein the applying of the first current comprises applying the first current by closing at least one the switches that are included in each of the first resistors to allow the first current flow to through a select one of the at least two variable resistors of the plurality of first resistors, and
wherein the applying of the second current comprises applying the second current by closing at least one the switches that are included in each of the second resistors to allow the second current to flow through a select one of the at least two variable resistors of the plurality of second resistors.

26. An electronic system comprising:
a neural network device comprising a neuromorphic device; and
a central processing unit (CPU) comprising a processor core and configured to control a function of the neural network device,
wherein the neuromorphic device comprises:
a first resistor line comprising a plurality of first resistors that are serially connected to each other;
a second resistor line comprising a plurality of second resistors that are serially connected to each other;
one or more current sources configured to control a current flowing in each of the first resistor line and the second resistor line to a respective current value;
a first capacitor configured to be electrically connected to the first resistor line; and
a second capacitor configured to be electrically connected to the second resistor line,
wherein respective voltages of the first and second capacitors represent results of first and second neuromorphic operations.

27. The electronic system of claim 26, wherein the neuromorphic device further comprises a switch configured to connect the first capacitor to the second capacitor in parallel.

28. The electronic system of claim 26, wherein the neuromorphic device further comprises a voltage meter configured to measure a voltage difference between both terminals of each of the first capacitor and the second capacitor in a configuration in which the first and second capacitors are connected in parallel.

29. The electronic system of claim 26, comprising:
wherein the one or more current sources include a first current source configured to apply a current to both of the first and second resistor lines, or second current sources configured to respectively apply currents to the first and second resistor lines, and
wherein each of the plurality of resistors comprises at least two variable resistors that are connected in parallel to each other and switches that are respectively serially connected to the at least two variable resistors.

30. The electronic system of claim 29, wherein each of the plurality of first and second resistors comprises one variable resistor that has a first resistance value and another resistor has a second resistance value.

31. The electronic system of claim 29, wherein the neuromorphic device further comprises a first weight line and a second weight line that are configured to be respectively electrically connected to respective terminals of each of the variable resistors dependent on respective operations of the switches, operations of first switches connected to the first weight line, and operations of second switches connected to the second weight line.

32. The electronic system of claim 29, wherein the neuromorphic device further comprises a voltage meter configured to measure a voltage of the first and/or second resistor lines.

33. A neuromorphic device comprising:
a first capacitor configured to be connected to a first resistor line via a first switch and to sample a total voltage of first resistor line in a first state in which the first switch is closed;
a second capacitor configured to be connected to a second resistor line via a second switch and to sample a total voltage of second resistor line in the first state in which the second switch is closed;
a third switch configured to connect the first capacitor and the second capacitor in parallel in a second state in which the first switch is open and the second switch is open; and
a voltage meter configured to measure a first voltage across the first capacitor and a second voltage across the second capacitor and to output an output value based on the sum of the first voltage and the second voltage.

34. The neuromorphic device of claim 33, wherein the output value is a sum of multiplications of inputs and weights applied to resistors included in each of the first resistor line and the second resistor line.

35. The neuromorphic device of claim 33, wherein a first terminal of the first capacitor is connected to the first resistor line in the first state, a first terminal of the second capacitor is connected to the second resistor line in the first state, and the third switch is connected between the first terminal of the first capacitor and the first terminal of the second capacitor.

36. The neuromorphic device of claim 33, wherein a first terminal of the first capacitor is connected to the first resistor line in the first state, a first terminal of the second capacitor is connected to the second resistor line in the first state, and the third switch is connected to a second terminal of the first capacitor and a second terminal of the second capacitor.

\* \* \* \* \*